(12) United States Patent
Perrott

(10) Patent No.: US 10,985,766 B1
(45) Date of Patent: *Apr. 20, 2021

(54) PHASE LOCKED LOOP CIRCUIT WITH OSCILLATOR SIGNAL BASED ON SWITCHED IMPEDANCE NETWORK

(71) Applicant: SiTime Corporation, Santa Clara, CA (US)

(72) Inventor: Michael H. Perrott, Nashua, NH (US)

(73) Assignee: SiTime Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/903,106

(22) Filed: Jun. 16, 2020

Related U.S. Application Data

(62) Division of application No. 16/505,469, filed on Jul. 8, 2019, now Pat. No. 10,720,929, which is a division
(Continued)

(51) Int. Cl.
*H03L 7/099* (2006.01)
*H03L 7/08* (2006.01)
(Continued)

(52) U.S. Cl.
CPC ......... *H03L 7/0992* (2013.01); *H03H 19/008* (2013.01); *H03L 7/0802* (2013.01);
(Continued)

(58) Field of Classification Search
CPC combination set(s) only.
See application file for complete search history.

(56) References Cited

U.S. PATENT DOCUMENTS

| | | | | | |
|---|---|---|---|---|---|
| 5,285,114 A | * | 2/1994 | Atriss | ...... | H03L 7/093 327/157 |
| 5,477,177 A | * | 12/1995 | Wong | ...... | H03L 7/085 327/156 |

(Continued)

OTHER PUBLICATIONS

Desgrez, et al., "A New MMIC Sampling Phase Detector Design for Space Applications," IEEE JSSC, vol. 38, pp. 1438-1442, Sep. 2003.
(Continued)

*Primary Examiner* — Adam D Houston

(57) ABSTRACT

Phase-locked loop circuitry to generate an output signal, the phase-locked loop circuitry comprising oscillator circuitry, switched resistor loop filter, coupled to the input of the oscillator circuitry (which, in one embodiment, includes a voltage-controlled oscillator), including a switched resistor network including at least one resistor and at least one capacitor, wherein an effective resistance of the switched resistor network is responsive to and increases as a function of one or more pulsing properties of a control signal (wherein pulse width and frequency (or period) are pulsing properties of the control signal), phase detector circuitry, having an output which is coupled to the switched resistor loop filter, to generate the control signal (which may be periodic or non-periodic). The phase-locked loop circuitry may also include frequency detection circuitry to provide a lock condition of the phase-locked loop circuitry.

21 Claims, 33 Drawing Sheets

Related U.S. Application Data of application No. 16/055,934, filed on Aug. 6, 2018, now Pat. No. 10,389,371, which is a division of application No. 15/284,302, filed on Oct. 3, 2016, now Pat. No. 10,063,244, which is a division of application No. 14/938,528, filed on Nov. 11, 2015, now Pat. No. 9,461,658, which is a division of application No. 14/466,988, filed on Aug. 23, 2014, now Pat. No. 9,203,417, which is a division of application No. 13/653,640, filed on Oct. 17, 2012, now Pat. No. 8,829,959, which is a division of application No. 12/860,875, filed on Aug. 21, 2010, now Pat. No. 8,299,826.

(60) Provisional application No. 61/236,682, filed on Aug. 25, 2009.

(51) Int. Cl.
| | |
|---|---|
| H03H 19/00 | (2006.01) |
| H03L 7/085 | (2006.01) |
| H03L 7/087 | (2006.01) |
| H03L 7/089 | (2006.01) |
| H03L 7/093 | (2006.01) |
| H03L 7/197 | (2006.01) |
| H03L 7/113 | (2006.01) |
| H03L 7/183 | (2006.01) |
| H03L 7/091 | (2006.01) |

(52) U.S. Cl.
CPC .............. *H03L 7/085* (2013.01); *H03L 7/087* (2013.01); *H03L 7/089* (2013.01); *H03L 7/091* (2013.01); *H03L 7/093* (2013.01); *H03L 7/113* (2013.01); *H03L 7/183* (2013.01); *H03L 7/1976* (2013.01)

(56) References Cited

U.S. PATENT DOCUMENTS

| | | | | | |
|---|---|---|---|---|---|
| 5,631,587 | A * | 5/1997 | Co | ............................ | H03L 7/107 327/107 |
| 6,130,561 | A * | 10/2000 | Dufour | .................. | H03L 7/0895 327/105 |
| 6,236,278 | B1 * | 5/2001 | Olgaard | .................. | H03L 7/107 327/156 |
| 6,853,252 | B2 * | 2/2005 | Dickmann | ................ | G06F 1/10 331/16 |
| 7,332,973 | B2 * | 2/2008 | Lee | ....................... | G04F 10/005 327/12 |
| 7,368,954 | B2 * | 5/2008 | Otomo | .................. | H03L 7/0893 327/156 |
| 7,586,347 | B1 * | 9/2009 | Ren | ....................... | H03L 7/0898 327/148 |
| 7,612,618 | B2 * | 11/2009 | Ko | ........................... | H03L 7/18 331/17 |
| 7,839,195 | B1 * | 11/2010 | Feng | ....................... | H03K 5/156 327/175 |
| 8,299,826 | B2 * | 10/2012 | Perrott | .................... | H03L 7/085 327/156 |
| 8,384,485 | B2 * | 2/2013 | Fortier | ..................... | H03L 7/099 331/16 |
| 10,060,864 | B2 * | 8/2018 | Kumar | .................... | G01N 23/04 |
| 2002/0097825 | A1 * | 7/2002 | Kawahara | ............. | H03L 7/0898 375/376 |
| 2005/0110537 | A1 * | 5/2005 | Wurzer | .................. | H03L 7/099 327/156 |
| 2005/0174156 | A1 * | 8/2005 | Wu | ....................... | H03K 5/1565 327/175 |
| 2005/0258907 | A1 * | 11/2005 | Zachan | .................. | H03L 7/107 331/16 |
| 2006/0158235 | A1 * | 7/2006 | Zachan | .................. | H03L 7/187 327/156 |
| 2007/0035347 | A1 * | 2/2007 | Sasaki | ..................... | H03L 7/107 331/16 |
| 2007/0164829 | A1 * | 7/2007 | Ko | ......................... | H03L 7/1976 331/17 |
| 2007/0194818 | A1 * | 8/2007 | Kim | ........................ | H03L 7/107 327/156 |
| 2008/0038001 | A1 * | 2/2008 | Becker | ................. | H04B 10/616 398/204 |
| 2008/0129391 | A1 * | 6/2008 | Ko | ........................ | H03L 7/107 331/18 |
| 2010/0073051 | A1 * | 3/2010 | Rao | ........................ | H03L 7/093 327/157 |
| 2010/0149040 | A1 * | 6/2010 | Ruelke | .................. | G01S 13/825 342/386 |
| 2010/0308878 | A1 * | 12/2010 | Feng | ...................... | H03K 5/156 327/156 |
| 2011/0050301 | A1 * | 3/2011 | Perrott | .................. | H03L 7/0802 327/156 |
| 2011/0080199 | A1 * | 4/2011 | Yen | ........................ | H03L 7/093 327/157 |
| 2011/0115535 | A1 * | 5/2011 | Min | ........................ | H03L 7/093 327/157 |
| 2012/0161832 | A1 * | 6/2012 | Lee | ........................ | H03L 7/0802 327/156 |
| 2012/0274370 | A1 * | 11/2012 | Fortier | .................... | H03L 7/099 327/156 |
| 2012/0313677 | A1 * | 12/2012 | Thomas | .................. | H03L 7/087 327/156 |
| 2014/0049304 | A1 * | 2/2014 | Houdebine | ........... | H03L 7/0895 327/157 |
| 2015/0070059 | A1 * | 3/2015 | Suzuki | ................... | H03L 7/093 327/156 |
| 2015/0222273 | A1 * | 8/2015 | Allan | ...................... | H03L 7/143 327/157 |
| 2015/0288371 | A1 * | 10/2015 | Prummel | .............. | H03L 7/1077 327/159 |
| 2016/0112055 | A1 * | 4/2016 | Mirajkar | ............... | H03L 7/1077 327/158 |
| 2016/0112795 | A1 * | 4/2016 | Bach | ...................... | H03M 3/356 381/93 |
| 2016/0164405 | A1 * | 6/2016 | Ravinuthula | ........... | H03L 7/085 327/157 |

OTHER PUBLICATIONS

G. Xiang, E. Klumperink, M. Bohsali, and B. Nauta, "A 2.2 GHz 7.6 mW sub-sampling PLL with ?126 dBc/Hz in-band phase noise and 0.15 ps rms jitter in 0.18 ?m CMOS," in IEEE Int. Solid-State Circuits Conf. Dig., 2009, pp. 392-393.

G. Xiang, E. Klumperink, M. Bohsali, and B. Nauta, "A Low Noise Sub-Sampling PLL in Which Divider Noise is Eliminated and PD/CP Noise is Not Multiplied by N/\2," IEEE Journal of Solid State Circuits, vol. 44, No. 12, Dec. 2009, pp. 3253-3263.

Gao et al., "A 2.2GHz 7.6mW Sub-Sampling PLL with—126dBc/Hz In-band Phase Noise and 0.15ps rms Jitter in 0.18um CMOS," Proceedings of IEEE ISSCC, pp. 392-393, 2009.

Gardner, "Charge-Pump Phase-Lock Loops," IEEE Transactions on Communications, vol. COM-28, pp. 1849-1858, Nov. 1980.

Hedayati et al., "A 3GHz wideband Sigma-Delta fractional-N synthesizer with voltage-mode exponential CP-PFD," IEEE Radio Frequency Integrated Circuits Symp., pp. 325-328, Jun. 2009.

Henry et al., "Comparative analysis of MEMS, programmable, and synthesized frequency control devices versus traditional quartz based devices," Proc. IEEE Frequency Control Symp., pp. 396-401, May 2008.

Hsu et al., "A Low-Noise Wide-BW 3.6-GHz Digital Delta-Sigma Fractional-N Frequency Synthesizer With a Noise-Shaping Time-to-Digital Converter and Quantization Noise Cancellation," IEEE JSSC, vol. 43, pp. 2776-2786, Dec. 2008.

Hu et al., "A 750 uW 1.575GHz temperature-stable FBAR-based PLL," IEEE Radio Frequency Integrated Circuits Symposium, pp. 317-320, Jun. 2009.

K. Puglia, "Phase-locked DRO uses a sampling phase detector," Microwaves and RF, pp. 103-111, Jul. 1993.

(56) References Cited

OTHER PUBLICATIONS

Kaehler, "Periodic-Switching Filter Networks—A Means of Amplifying and Varying Transfer Functions," IEEE JSSC, vol. 4, pp. 225-230, Aug. 1969.
Kurahashi et al., "A 0.6V Highly Linear Switched-R-MOSFET-C Filter," Proc. of the IEEE 2006 Custom Integrated Circuits Conference, pp. 833-836, Sep. 2006.
Kurahashi et al., "Design of Low-Voltage Highly Linear Switched-R-MOSFET-C Filters," IEEE JSSC, vol. 42, pp. 1669-1709, Aug. 2007.
McCorquodale et al., "A 0.5 to 480 MHz self-referenced CMOS clock generator with 90ppm total frequency error and spreadspectrum capability," Proc. of IEEE ISSCC, pp. 350-619, Feb. 2008.
McCorquodale et al., "A Monolithic and self-referenced RF LC clock generator compliant with USB 2.0," IEEE JSSC, vol. 42, pp. 385-399, Feb. 2007.
Otis et al., "A 300 uW 1.9GHz CMOS oscillator utilizing micromachined resonators," IEEE JSSC, vol. 38, pp. 1271-1274, Jul. 2003.
Perrott et al., "A Low Area, Switched-Resistor Based Fractional-N Synthesizer Applied to a MEMS-based Programmable Oscillator," IEEE ISSC, vol. 45, pp. 244-245, Feb. 2010.
Perrott et al., "A Low-Area Switched-Resistor Loop-Filter Technique for Fractional-N Synthesizers Applied to a MEMS Based Programmable Oscillator," Proc. of IEEE ISSCC, pp. 244-245, Feb. 2010.
Perrott et al., "A Modeling Approach for Sigma-Delta Fractional-N Frequency Synthesizers Allowing Straightforward Noise Analysis," IEEE JSSC, vol. 37, Aug. 2002.
Perrott, "CppSim System Simulator." http://www.cppsim.com.
Petit et al., "Thermally stable oscillator at 2.5 GHz using temperature compensated BAW resonator and its integrated temperature sensor," Proc. IEEE Ultrasonics Symp., pp. 895-898, Nov. 2008.
Rai et al, "A Digitally Compensated 1.5 GHz CMOS/FBAR Frequency Reference," IEEE Trans. on Ultrasonics, Ferroelectrics, and Frequency Control, vol. 57, pp. 552-561, Mar. 2010.
Rhee, "Design of high-performance CMOS charge pumps in phase-locked loops," IEEE International Symp. on Circuits and Systems, vol. 2, pp. 545-548, 1999.
Riley et al., "Delta-Sigma Modulation in Fractional-N Frequency Synthesis," IEEE JSSC, vol. 28, pp. 553-559, May 1993.
S. Desgrez, D. Langrez, M. Delmond, J.-C. Cayrou, and J.-L. Cazaux, "A new MMIC sampling phase detector design for space applications," IEEE J. Solid-State Circuits, vol. 38, No. 9, pp. 1438-1442, Sep. 2003.
Stark et al., "An Ultra-Thin Packaged MEMS Oscillator," Solid-State Sensors, Actuators, and Microsystems Workshop, pp. 6-9, Jun. 2008.
Vaucher et al., "A Family of Low-Power Truly Modular Programmable Dividers in Standard 0.35-um CMOS Technology," IEEE JSSC, vol. 35, pp. 1039-1045, Jul. 2000.
Wang et al., "Spurious Tone Suppression Techniques Applied to a Wide-Bandwidth 2.4 GHz Fractional-N PLL," IEEE JSSC, vol. 43, pp. 2787-2797, Dec. 2008.
Zhang et al., "A fast switching PLL frequency synthesizer with an on-chip passive discrete-time loop filter in 0.25um CMOS," IEEE JSSC, vol. 38, pp. 855-865, Jun. 2003.

\* cited by examiner

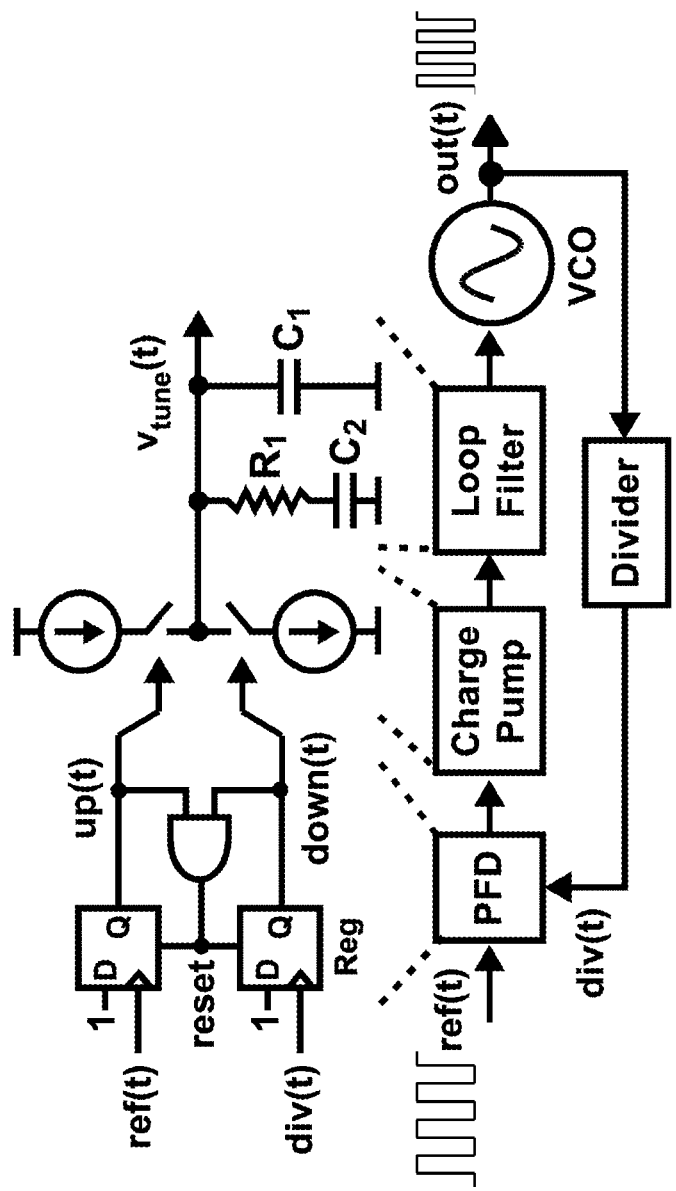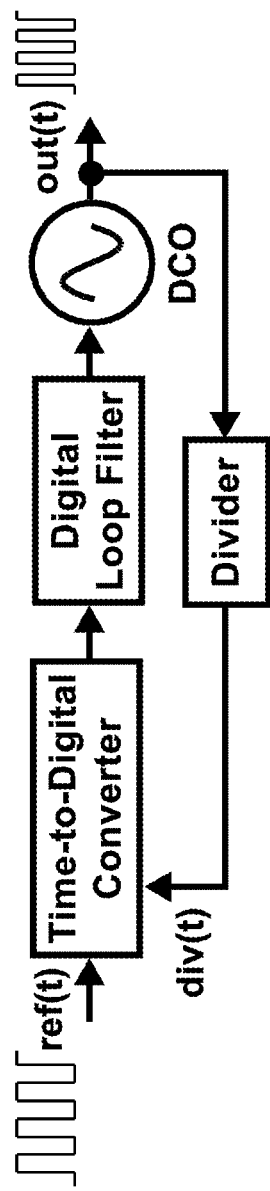
Figure 1A (Prior Art) (a) Classical Charge Pump PLL
Figure 1B (Prior Art) (b) Digital PLL

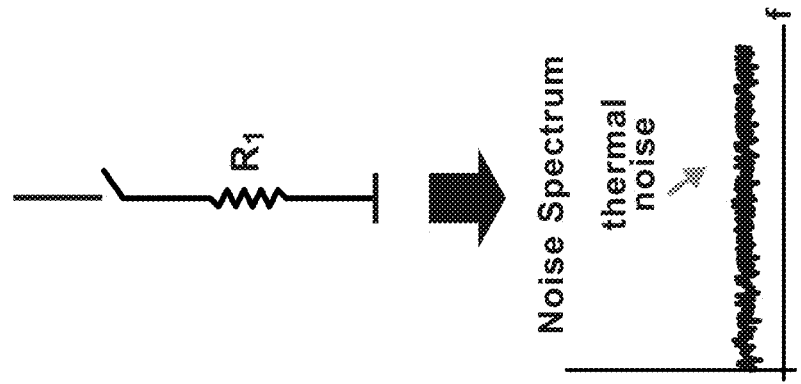
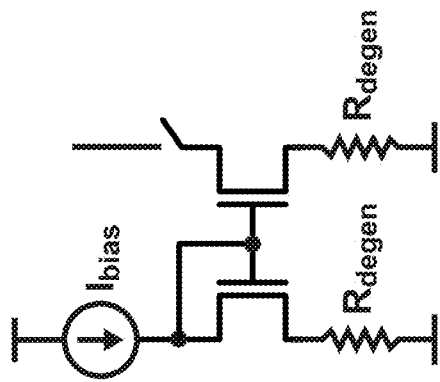
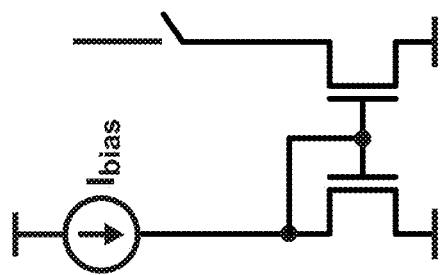
Figure 3A (Prior Art) — (a) Charge Pump Using Simple Current Mirror
Figure 3B (Prior Art) — (b) Charge Pump Using Degenerated Current Mirror
Figure 3C — (c) Switched Resistor

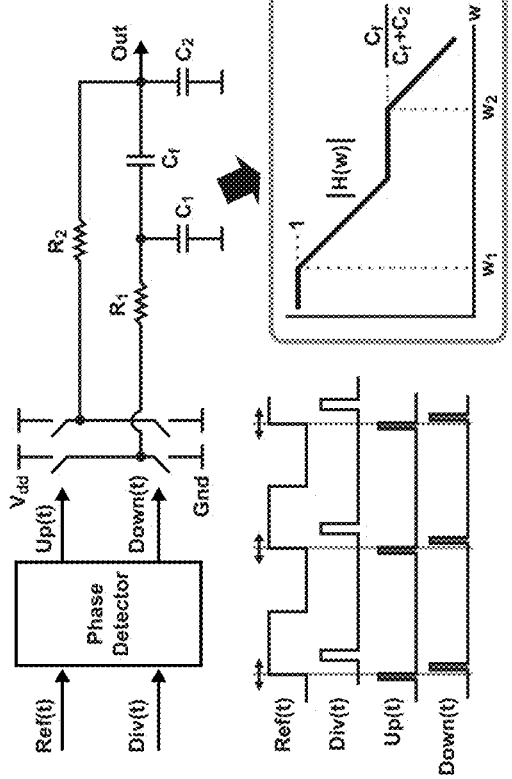
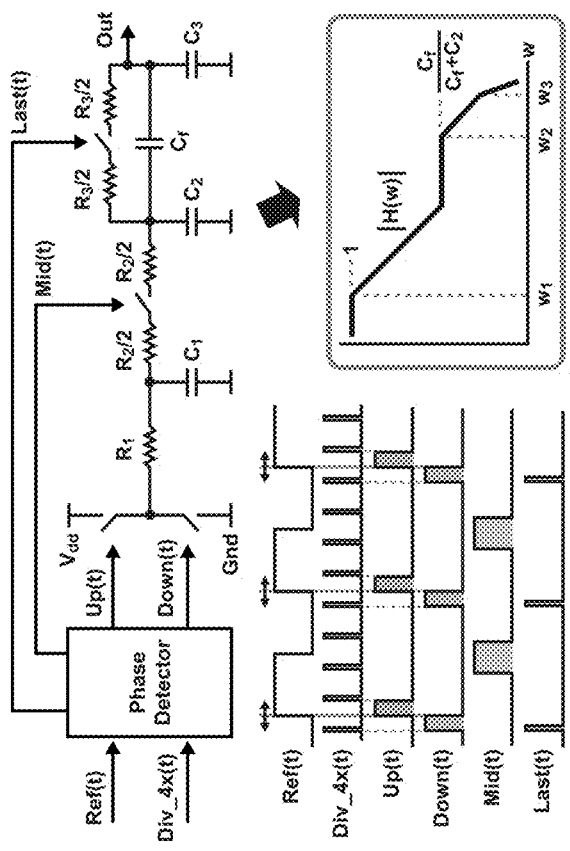
Figure 5A
Figure 5B

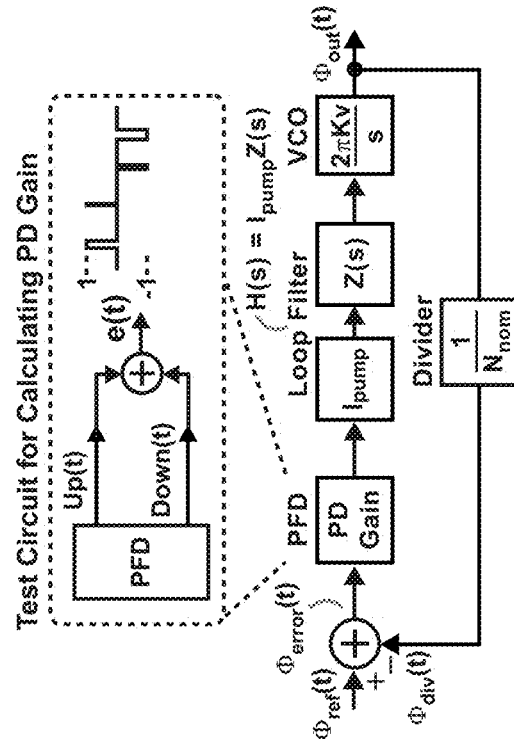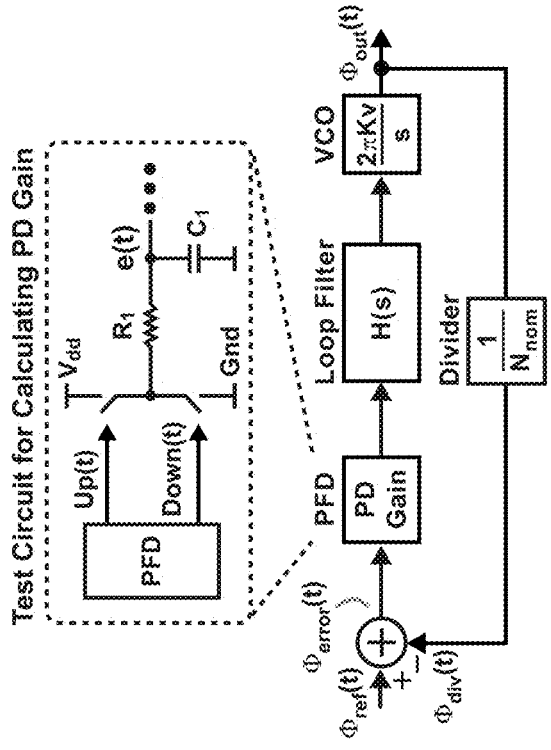
Figure 6A
(Prior Art)
Figure 6B

PHASE LOCKED LOOP CIRCUIT WITH OSCILLATOR SIGNAL BASED ON SWITCHED IMPEDANCE NETWORK

RELATED APPLICATIONS

This non-provisional application is a divisional of U.S. patent application Ser. No. 16/505,469, filed Jul. 8, 2019, entitled "Integrated Circuit With Oscillator Signal Based On Switched-Resistance Circuitry," which is a divisional of U.S. patent application Ser. No. 16/055,934, filed Aug. 6, 2018, entitled "Phase Locked Loop With Switched-Component Loop Filter" (now U.S. patent Ser. No. 10/389,371), which is a divisional of U.S. patent application Ser. No. 15/284,302, filed Oct. 3, 2016, entitled "PLL With Accelerated Frequency Lock" (now U.S. Pat. No. 1,063,244) which is a divisional of U.S. patent application Ser. No. 14/938,528, filed Nov. 11, 2015, entitled "High-Gain Locked-Loop Phase Detector" (now U.S. Pat. No. 9,461,658), which is a divisional of U.S. patent application Ser. No. 14/466,988, filed Aug. 23, 2014, entitled "Phase Locked Loop Circuitry Having Switched Resistor Loop Filter Circuitry, and Methods of Operating Same" (now U.S. Pat. No. 9,203,417), which is a divisional of U.S. patent application Ser. No. 13/653,640, filed Oct. 17, 2012, entitled "Phase Locked Loop Circuitry Having Switched Resistor Loop Filter Circuitry, and Methods of Operating Same" (now U.S. Pat. No. 8,829,959), which is a divisional of U.S. patent application Ser. No. 12/860,875, filed on Aug. 21, 2010, entitled "Phase Locked Loop Circuitry Having Switched Resistor Loop Filter Circuitry, and Methods of Operating Same" (now U.S. Pat. No. 8,299,826), which claims the benefit of U.S. Provisional Application No. 61/236,682, entitled "Switched Resistor Loop Filter Circuitry, Low Area/Power Implementation of Phase Locked Loop Circuits, and Methods of Manufacturing and Operating Same," filed Aug. 25, 2009. Each of the foregoing patent applications is hereby incorporated by reference herein in its entirety.

INTRODUCTION

Phase-locked loop (PLL) circuits are a key component of most modern communication circuits, and are also used in a variety of digital processor applications in order to generate high frequency, low jitter clock sources. While there are a wide variety of PLL architectures that have been proposed, the charge pump PLL, which is shown in FIG. 1A, has emerged as the most popular analog implementation, and is composed of a phase/frequency detector (PFD), charge pump, RC network, voltage controlled oscillator (VCO), and frequency divider. More recently, the digital PLL structure, shown in FIG. 1B, has gained attention due to its high compatibility with advanced CMOS processes, and is composed of a time-to-digital converter (TDC), digital loop filter, digitally controlled oscillator (DCO), and frequency divider.

While the existing analog and digital PLL structures are now well proven and can satisfy the performance needs for a wide variety of applications, they have shortcomings when trying to achieve complete integration of the PLL with low silicon area and low power consumption. On the analog side, charge pump PLLs are well known to require a very large capacitor in their loop filter, which directly impedes the goal of achieving low silicon area. In fact, it is not uncommon for the capacitor area requirements to be so large that it must be placed off-chip, which negatively impacts the noise sensitivity of the PLL and adds to manufacturing cost of the intended product for the PLL. In addition, 1/f noise from the charge pump is often a significant issue when seeking low phase noise for the PLL. On the digital side, an advantage of the digital PLL is that its loop filter can be quite small in area and easily configured for a wide variety of applications, and a well designed TDC can achieve low 1/f noise. However, since a digital PLL contains many signals that continuously switch between supply and ground, achieving very low power consumption can be challenging, especially if older CMOS fabrication processes, such as 0.18 u CMOS, are utilized.

When striving for both low power and low area, one could first decide whether the analog or digital strategy provides the best starting point. A key insight is that simplicity in design, i.e., minimizing the number of "moving parts", will typically benefit both of these goals. As such, we propose advancing the analog approach by seeking dramatic reduction of the loop filter capacitor and reduced impact of 1/f noise. In particular, while not exhaustive of the inventions described and/or illustrated herein, we will discuss and/or illustrate new techniques and circuitry in the areas of:

1) switched resistor networks, architectures, topologies and circuitry to, for example, implement in a loop filter,
2) switched resistor loop filter architectures, topologies and circuitry,
3) phase detector architectures, topologies and circuitry that reduce the impact of loop filter noise by achieving high gain in their detection characteristic, and
4) methods of frequency detection—for example, frequency detection methods that "leverage" switched capacitors and digital logic to achieve rapid frequency acquisition in robust manner.

SUMMARY

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

Importantly, the present inventions are neither limited to any single aspect nor embodiment, nor to any combinations and/or permutations of such aspects and/or embodiments. Moreover, each of the aspects of the present inventions, and/or embodiments thereof, may be employed alone or in combination with one or more of the other aspects and/or embodiments thereof. For the sake of brevity, certain permutations and combinations are not discussed and/or illustrated separately herein.

In a first principle aspect, certain of the present inventions are directed to phase-locked loop circuitry to generate an output signal, the phase-locked loop circuitry comprising oscillator circuitry having an input and an output, switched resistor loop filter, having an output which is coupled to the input of the oscillator circuitry (which, in one embodiment, includes a voltage-controlled oscillator), the switched resistor loop filter includes a switched resistor network including at least one resistor and at least one capacitor, wherein an effective resistance of the switched resistor network is responsive to and increases as a function of one or more pulsing properties of a control signal (wherein pulse width and frequency (or period) are pulsing properties of the control signal). The phase-locked loop circuitry of this aspect of the inventions further includes phase detector circuitry, having an output which is coupled to the switched resistor loop filter, to generate the control signal (which may be a periodic or non-periodic signal).

In one embodiment, one of the pulsing properties of the control signal is a pulse on-time and the pulse on-time of the control signal is shorter than an RC time constant of the switched resistor network. In another embodiment, the effective resistance of the switched resistor network is determined by an average pulse width and average frequency of the control signal. Here, the control signal may be non-periodic.

The phase-locked loop circuitry of this aspect of the inventions may also include divider circuitry, disposed in a feedback path, to couple the output of the oscillator circuitry to an input of the phase detector circuitry.

In another aspect, the present inventions are directed to phase-locked loop circuitry to generate an output signal, the phase-locked loop circuitry comprising oscillator circuitry (which, in one embodiment, includes a voltage-controlled oscillator), switched resistor loop filter, coupled to the input of the oscillator circuitry, the switched resistor loop filter includes a switched resistor network including a plurality of resistors, a plurality of capacitors and at least one switch, wherein an effective resistance of the switched resistor network is responsive to and increases as a function of one or more pulsing properties of a control signal, and phase detector circuitry, having an output which is coupled to the switched resistor loop filter, to generate the control signal (which may be a periodic or non-periodic signal).

In this aspect of the present inventions, the phase-locked loop circuitry also includes divider circuitry. In one embodiment, the divider circuitry includes a division factor so that the phase-locked loop circuitry, in operation, provides an integer-N multiple of the reference frequency, where N is greater than 1. In another embodiment, the divider circuitry includes a division factor so that the phase-locked loop circuitry, in operation, provides a fractional-N multiple of the reference frequency, where the integer portion, N, is greater than 0 and the fractional component is within the range of 0 to 1.

In one embodiment, one of the pulsing properties of the control signal is a pulse on-time and the pulse on-time of the control signal is shorter than an RC time constant of the switched resistor network. In another embodiment, the effective resistance of the switched resistor network is determined by an average pulse width and average frequency of the control signal.

Notably, the oscillator circuitry, switched resistor loop filter, phase detector circuitry and divider circuitry may be portions of a monolithic integrated circuit device.

In yet another aspect, the present inventions are directed to phase-locked loop circuitry comprising oscillator circuitry, switched resistor loop filter, coupled to an input of the oscillator circuitry, the switched resistor loop filter includes a switched resistor network including a plurality of resistors, a plurality of capacitors and at least one switch, wherein an effective resistance of the switched resistor network is responsive to and increases as a function of one or more pulsing properties of a control signal, phase detector circuitry, having an output which is coupled to the switched resistor loop filter, to generate the control signal (which may be periodic or non-periodic) and divider circuitry to couple the output of the oscillator circuitry to an input of the phase detector circuitry.

In this aspect, the phase-locked loop circuitry also includes frequency detection circuitry, coupled to the output of the divider circuitry, to provide a lock condition of the phase-locked loop circuitry. The frequency detection circuitry includes (i) circuitry to generate a signal which is representative of the frequency of the output signal of the phase-locked loop circuitry, (ii) comparison circuitry to compare the signal which is representative of the frequency of the output signal of the phase-locked loop circuitry to a reference input to the phase-locked loop circuitry, and (iii) a switched capacitor network including at least one capacitor.

In one embodiment, the circuitry of the frequency detection circuitry includes a counter to generate the signal which is representative of the frequency of the output signal of the phase-locked loop circuitry.

In another embodiment, one of the pulsing properties of the control signal is a pulse on-time such that the pulse on-time of the control signal is shorter than an RC time constant of the switched resistor network.

In yet another embodiment, the effective resistance of the switched resistor network is determined by an average pulse width and average frequency of the control signal. In this embodiment, the control signal may be non-periodic.

As stated herein, there are many inventions, and aspects of the inventions, described and illustrated herein. This Summary is not exhaustive of the scope of the present inventions. Indeed, this Summary may not be reflective of or correlate to the inventions protected by the claims in this or continuation/divisional applications hereof.

Moreover, this Summary is not intended to be limiting of the inventions or the claims (whether the currently presented claims or claims of a divisional/continuation application) and should not be interpreted in that manner. While certain embodiments have been described and/or outlined in this Summary, it should be understood that the present inventions are not limited to such embodiments, description and/or outline, nor are the claims limited in such a manner (which should also not be interpreted as being limited by this Summary).

Indeed, many other aspects, inventions and embodiments, which may be different from and/or similar to, the aspects, inventions and embodiments presented in this Summary, will be apparent from the description, illustrations and claims, which follow. In addition, although various features, attributes and advantages have been described in this Summary and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed and/or illustrated separately herein.

FIG. 1A is a schematic block diagram representation of a classical charge pump PLL;

FIG. 1B is a schematic block diagram representation of a digital PLL;

FIGS. 3A-3C illustrate the relationship of 1/f noise to various configurations wherein FIG. 3A corresponds to high 1/f noise from MOS current mirror yields high noise in charge pump, FIG. 3B corresponds to reduction of 1/f noise in charge pump by using resistor degeneration, FIG. 3C corresponds to dramatic reduction of 1/f noise by using proposed "switched resistor" technique instead a MOS current mirror;

FIGS. 5A and 5B illustrate exemplary embodiments of loop filters according to certain aspects of the present inventions wherein the exemplary loop filters employ switched resistor embodiments according to certain aspects of the present inventions; notably, FIG. 5A is a topology that includes high comparison frequency and wide PLL bandwidth (High Reference Frequency), and FIG. 5B is a topology that includes a multi-phase approach providing high rejection of reference spurs (Low Reference Spur);

FIGS. 6A and 6B illustrate modeling of phase detector gain and overall PLL dynamics, wherein FIG. 6A is associated with a classical charge pump PLL, and FIG. 6B is associated with a switched resistor PLL;

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

At the outset, it should be noted that there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

Further, in the course of describing and illustrating the present inventions, various structures, components, materials and/or elements, as well as combinations and/or permutations thereof, are set forth. It should be understood that structures, components, materials and/or elements other than those specifically described and illustrated, are contemplated and are within the scope of the present inventions, as well as combinations and/or permutations thereof.

Notably, certain aspects and/or embodiments of the present inventions (including certain components, materials and/or elements of the present inventions, as well as combinations and/or permutations thereof) are described and illustrated in EXHIBITS 1 and 2 of the Provisional Application. Such aspects and/or embodiments may be in lieu of or in addition to those described and illustrated herein. Indeed, the aspects and/or embodiments of the present inventions described and illustrated in EXHIBITS 1 and 2 of the Provisional Application may provide further technical support for those aspects and/or embodiments of the present inventions described and illustrated herein. EXHIBITS 1 and 2 of the Provisional Application are to be considered as a portion of the description of the present inventions.

Figure 2A:
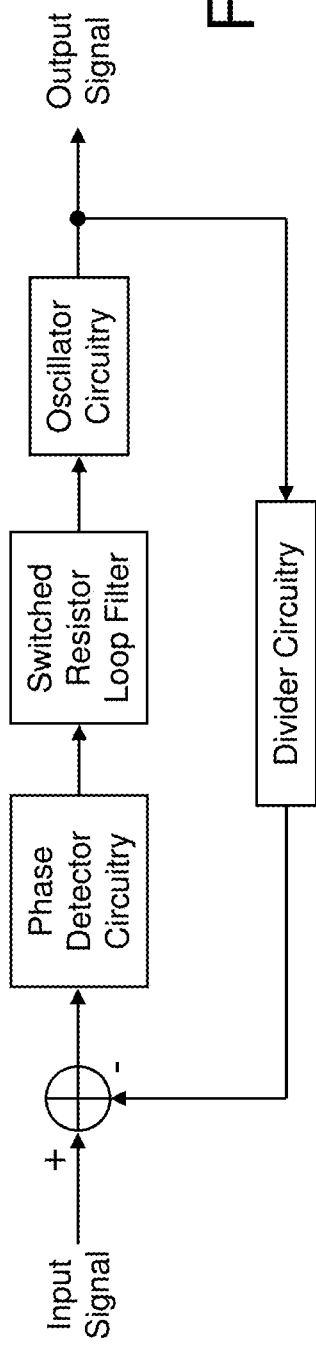
FIG. 2A illustrates a block diagram representation of an exemplary embodiment of switched resistor phase-locked loop (PLL) structure/circuitry according to certain aspects of the present inventions.
Figure 2B:
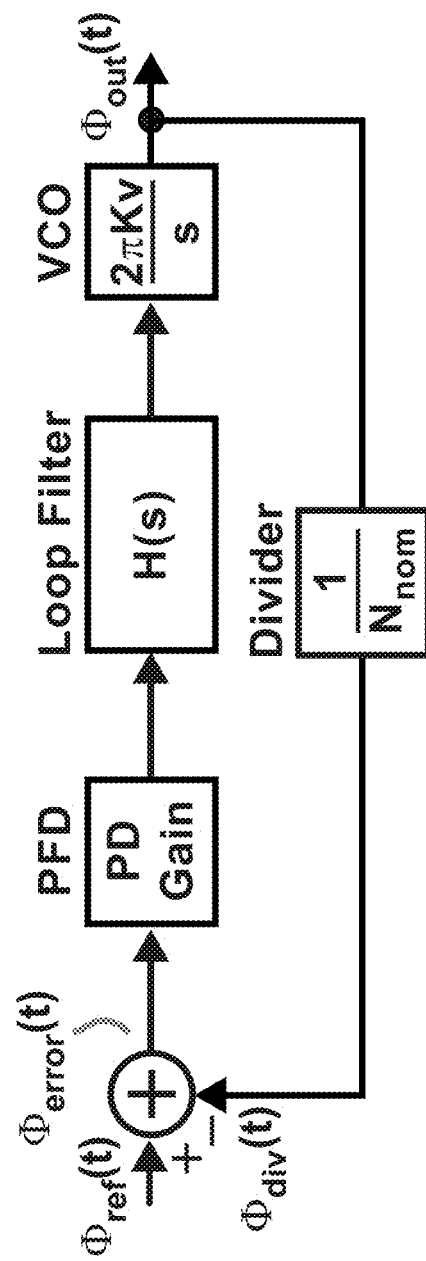
FIG. 2B illustrates a modeling of an exemplary switched resistor phase-locked loop (PLL) structure/circuitry according to certain aspects of the present inventions.

With that in mind, in one aspect, the present inventions are directed to a switched resistor network for phase-locked loop (PLL) structure/circuitry. In another aspect, the present inventions are directed to a switched resistor phase-locked loop (PLL) structure/circuitry. (See, for example, FIGS. 2A and 2B). In yet another aspect, the present inventions are directed to techniques to implement a low area and/or low power switched resistor PLL structure/circuitry. The present inventions are also directed to methods of operating, controlling and manufacturing PLL circuitry according to one or more aspects and/or embodiments of the present inventions.

In another aspect, the present inventions are directed to switched capacitor frequency detection circuitry and techniques. When implemented in conjunction with PLL circuitry (for example, whether the PLL circuitry of the present inventions or conventional type PLL circuitry, for example, circuitry employing a charge pump circuit), the frequency detection circuitry provides a rapid and robust lock condition of the PLL circuitry.

Notably, PLL structures/circuitry according to one or more aspects and/or embodiments of the present inventions may include direct connection of a passive RC network to a phase detector (PD) without a charge pump to, for example, improve 1/f noise performance, pulsing of one or more resistor elements to increase the associated resistance value, high gain PD implementations to compensate for the low DC gain of the passive loop filter and to improve PLL noise performance, and an efficient frequency detection method using a switched capacitor network to achieve relatively robust and rapid frequency acquisition.

A. Exemplary Switched Resistor Network

The switched resistor network, according to at least certain embodiments of the present inventions, employs switches (for example, CMOS devices) to gate current into a resistor network (for example, one or more resistor elements). A benefit of doing so is to lower the impact of 1/f noise, as indicated by FIGS. 3A-3C. As shown in FIG. 3A, a basic charge pump consists of a current mirror whose output is switched on or off. Unfortunately, as mentioned earlier, the CMOS devices have substantial 1/f noise which will directly degrade the low frequency noise performance of the charge pump and the overall PLL. As shown in FIG. 3B, we can reduce the impact of the CMOS 1/f noise by degenerating the CMOS devices with resistor elements such as polysilicon resistors. Since such resistors have negligible 1/f noise in comparison to CMOS devices, the 1/f noise can be reduced in proportion to the amount of voltage that is dropped across the resistor (i.e., higher voltage drops yields lower 1/f noise). As shown in FIG. 3C, a version of resistor degeneration drops all of the voltage across the resistor by eliminating the CMOS current mirror device. Ideally, 1/f noise is eliminated in this embodiment, but in practice the switch, which typically corresponds to a CMOS device in its triode region, will have a finite voltage drop across it, and therefore will add some 1/f noise. Also, in the embodiment where the resistor is connected to a power supply node, the 1/f noise of the power supply will also have an impact on the current through the resistor. However, in either of these embodiments, the degeneration offered by the resistor should significantly reduce the impact of such 1/f noise compared to classical charge pump structures.

Figure 4A:
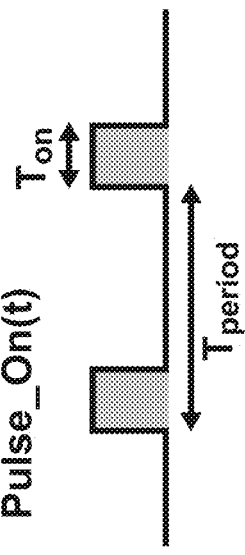
FIGS. 4A-4C depict the impact of switching characteristics on effective resistor value, wherein FIG. 4A corresponds to a pulse waveform for turning on and off resistor switch, FIG. 4B (ideal switched resistor) corresponds to ideal multiplication effect of switching waveform, and FIG. 4C (practical switched resistor) corresponds to reduced multiplication effect of switching waveform due to parasitic capacitance.
Figure 4B:
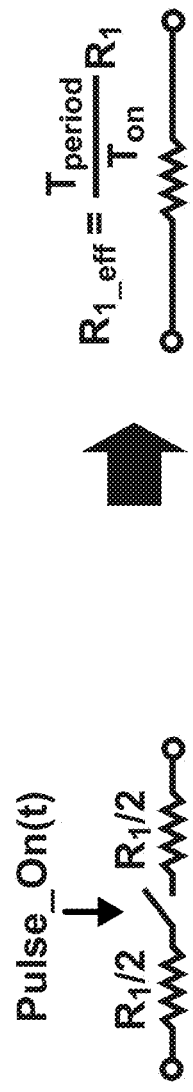

The effective resistance of switching a resistor may be characterized as a function of the pulse duration and frequency of the switching action. An intuitive explanation of this behavior is that given a specified voltage across the resistor, the average current through the resistor will be reduced as the pulse width and/or pulse frequency is reduced, which directly increases its effective resistance. FIG. 4A illustrates an exemplary parameterized view of a pulse waveform driving the switch on and off, and FIG. 4B illustrates the effective resistance that would ideally be achieved as a function of the pulse width ($T_{on}$) and frequency ($1/T_{period}$). Indeed, the pulse width and frequency (or period) are "pulsing properties" of the switching signal. Note that very large effective resistance values can be achieved in theory, and a continuous range of values supported by appropriate choice of $T_{on}$ and $T_{period}$. Notably, the functional relationship of the effective resistance of switching a resistor to the pulse duration and frequency of the switching action may be linear or non-linear.

While FIG. 4A illustrates or suggests the pulse waveform as a periodic signal, the signal to control the resistor network may also be implemented as a non-periodic signal. For example, in one embodiment, a desired value of effective resistance may be obtained or achieved through proper choice of the average pulse width and average frequency of the pulse waveform. Notably, one potential benefit of utilizing a non-periodic pulse waveform is that spurious content in its power spectrum can be substantially reduced, which could be useful for certain applications. In short, the signal to control the resistor network may be a periodic signal and/or a pseudo-periodic or non-periodic signal (collectively referred to hereinafter as "non-periodic"), all of which are intended to fall within the scope of the present inventions. Thus, although the discussions herein at times may illustrate or intimate a periodic signal, the present inventions may be implemented using non-periodic signals to control the resistor network which are intended to fall within the scope of the present invention; however for the sake of brevity, such discussions, in the context of non-periodic signals may not be repeated in detail.

Figure 4C:
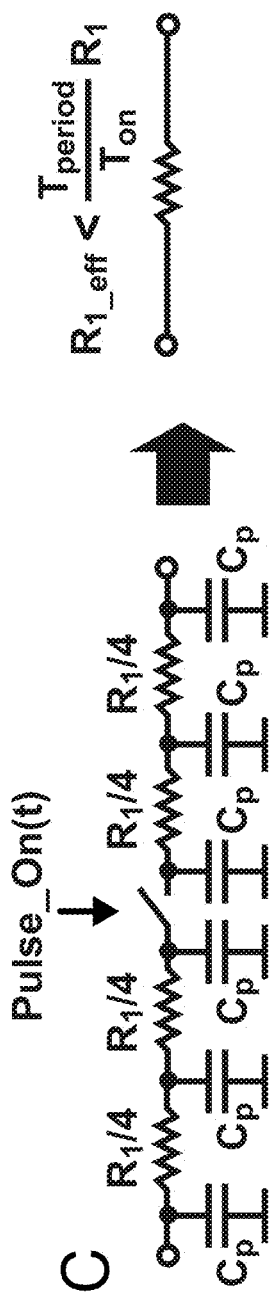

In practice, the effective resistance of a switched resistor will also be impacted by parasitic capacitance, as indicated by FIG. 4C. A key intuition here is that charge is transferred between the capacitances on each side of the switch while it is on, and that charge then passes through the resistor on each side of the switch while it is off. Due to this extra flow of charge, the average current is increased above the ideal value such that the effective resistance is lowered. Due to the distributed nature of capacitance on a practical resistor element, the reduction of effective resistance will nontrivially depend on $T_{on}$ and $T_{period}$ of the switch pulse signal. Although an analytical model can certainly be derived, a straightforward method to estimate the actual effective resistance is to simulate the switched resistor circuit (with the inclusion of the estimated distributed capacitance as shown in FIG. 4C) in transient operation with a circuit simulator such as SPICE. In particular, a voltage source can be placed across the terminals of the device, and the average current observed in simulation as a function of $T_{on}$ and $T_{period}$.

When large effective resistance is desired, it may be advantageous to reduce parasitic capacitance through appropriate choice of the resistor element (i.e., high resistance poly rather than low resistance poly), to reduce device parasitic capacitance by using the smallest switch size (i.e., smallest CMOS device) that still achieves a switch resistance that is significantly less than the resistor element resistance, and to be careful of leakage currents through the switch. Also, placing the switch on one side of the resistor, as opposed to in the middle as shown in FIG. 4C, may lower the impact of parasitic capacitance. In general, reduction of $T_{on}$ beyond a certain point will lead to diminishing returns in increasing the effective resistance since the charge transferred by parasitic capacitance will become a more significant portion of the average current in such embodiment. At that point, increase of $T_{period}$ then becomes the primary tuning parameter for increasing resistance further, wherein the effective resistance may eventually become limited by leakage paths. For example, in 0.18 u CMOS, multiplication factors (i.e., $T_{period}/T_{on}$) of well over 20 are easily achievable, such that greater than 10 MegaOhm effective resistance may be provided with 500 kOhm of poly resistance.

In one embodiment, the pulse width or pulse on-time ($T_{on}$) of the switching signal is shorter than an RC time constant of the switched resistor network. In this way, the effective resistance of the switched resistor network increases as a function of one or more pulsing properties (pulse width or frequency) of the switching or control signal of the switched resistor network.

Notably, it may be advantageous to employ circuitry, structures, architectures and/or techniques to increase the effective resistance of a switched resistor. Indeed, all such circuitry, structures, architectures and/or techniques, whether now known or later developed, are intended to fall within the scope of the present inventions. For example, one such structure, architecture and/or technique is to increase the number of switches utilized in the resistor network. (See, EXHIBIT 2 of the Provisional Application).

B. Exemplary Switched Resistor Loop Filter Topologies

Classical charge pump PLL topologies yield a loop filter transfer function which is well understood and consists of the combination of a lossy integrator (formed by the charge pump current integrating on capacitor $C_2$) and a wider bandwidth feedforward path with gain $R_1 I_{pump}$ (and bandwidth $w_2$). An advantage of the high DC gain is that it forces the average net current from the charge pump to be close to zero during steady state operation of the PLL, which leads to a well controlled average phase error in the PLL phase detector. The primary advantages of such phase error control are that short pulses can be achieved at the charge pump output, which lowers the impact of reference spurs, thermal noise, and 1/f noise of the charge pump on the PLL output phase noise. Due to mismatch between the current sources, the overall charge pump characteristic will often be nonlinear, which introduces a challenge when trying to achieve low noise with fractional-N PLL structures.

As shown in FIGS. 5A and 5B, loop filters implementing a switched resistor network may achieve a similar transfer function as obtained with a charge pump loop filter, with the exception that the DC gain may be constrained to be one. In the exemplary embodiment of FIG. 5A, the low frequency pole, $w_1$, is primarily set by $R_2$ and $C_2$, the feedforward gain is primarily set as the ratio $C_f/(C_f+C_2)$, and the high frequency pole, $w_2$, is primarily set by $R_1$ and $C_1$. In FIG. 5B, the low frequency pole is primarily set by $R_3$ and $C_3$, the feedforward gain is primarily set by the ratio $C_f/(C_f+C_3)$, and two high frequency poles are primarily set by $R_1$, $R_2$, $C_1$, and $C_2$.

These two exemplary loop filters illustrate the versatility of the switched resistor concept in addressing the needs of a variety of PLL applications. One of the considerations seen in comparing the two designs is the need to consider switch resistance, which should generally be lower in value than the resistor value that is being switched. In the embodiment of FIG. 5A, the switches are placed with direct connection to supply or ground, whereas in the embodiment of FIG. 5B, the switches are also placed between resistor elements whose node voltages will typically fall in a mid-rail range (i.e., somewhere between supply and ground). Notably, other supply and ground configurations are suitable.

Assuming that the switches are implemented with CMOS transistors, the lowest resistance of the switch is achieved when it directly connects to supply or ground. As such, the switches in FIG. 5A can be implemented with relatively small device sizes, and can be switched at fairly high frequencies due to the small parasitic capacitance of the switches. In contrast, the switches in FIG. 5B that are placed between resistor elements should be sized larger than the ones connected directly to power and ground, and the resulting parasitic capacitance limits how fast the switching can occur while still getting the desired boost in effective resistance values. An advantage of the topology in FIG. 5B, however, may be that the out-of-phase switching of resistors $R_1$, $R_2$, and $R_3$ act to isolate the ripple caused by the pulsing action of the phase detector such that excellent reference spur rejection is achieved. In addition to the requirement of larger switches, the cost of the out-of-phase switching technique is the introduction of delay in the loop filter. Notably, the additional delay may degrade phase margin in PLL applications demanding relatively high PLL bandwidth.

C. Exemplary Phase Detector Design

As discussed in the previous subsection, a significant difference between the loop filter provided by a charge pump PLL versus that of a switched resistor PLL is that the DC gain can be quite large for the charge pump embodiment, but may be constrained to be no more than one for the switched resistor embodiment. In this subsection, we describe exemplary embodiments of how to adjust other components of the PLL to accommodate lower DC gain which may be offered by the switched resistor loop filter. In particular, we propose exemplary high gain phase detector (PD) implementations, and discuss the benefits of this approach in terms of noise performance of the PLL. Note that the VCO gain, Kv, may also be made larger to accommodate for those embodiments including lower DC gain offered by the switched resistor loop filter.

To better understand the impact of DC gain of the loop filter, we first examine basic models of the charge pump and switched resistor PLLs as shown in FIGS. 6A and 6B. In the charge pump PLL, as shown in FIG. 6A, the loop filter transfer function, H(s), is modeled as the charge pump current, $I_{pump}$, multiplied by the impedance of the loop filter RC network, Z(s). The phase detector and divider are modeled as simple gain elements (note that gain can be less than one), and the VCO is modeled as an integrator with gain $K_v$. In the switched resistor PLL embodiment, as shown in FIG. 6B, the modeling follows in a similar pattern to the charge pump PLL, with the subtle difference being that the loop filter transfer function, H(s), is simply defined as the voltage gain through the RC network.

Due to the subtle difference in loop filter characterization, the PD gain may be computed in a slightly different manner for the two different types of PLL structures. In each embodiment, an error signal, e(t), is formed at the output of the PD and averaged for each value of the phase difference, $\phi_{error}(t)$. The difference between the PD gain calculation for the PLL structures lies in how e(t) is formed. In the embodiment of the charge pump PLL, FIG. 6A indicates that e(t) corresponds to a pulse train that alternates between −1, 1, and 0 depending on whether a down pulse, up pulse, or no pulses occur, respectively. In the embodiment of the switched resistor PLL, FIG. 6B indicates that e(t) corresponds to the output of an RC network that is that is connected to ground, supply, or has no connection to either depending on whether a down pulse, up pulse, or no pulses occur, respectively.

Figure 7:
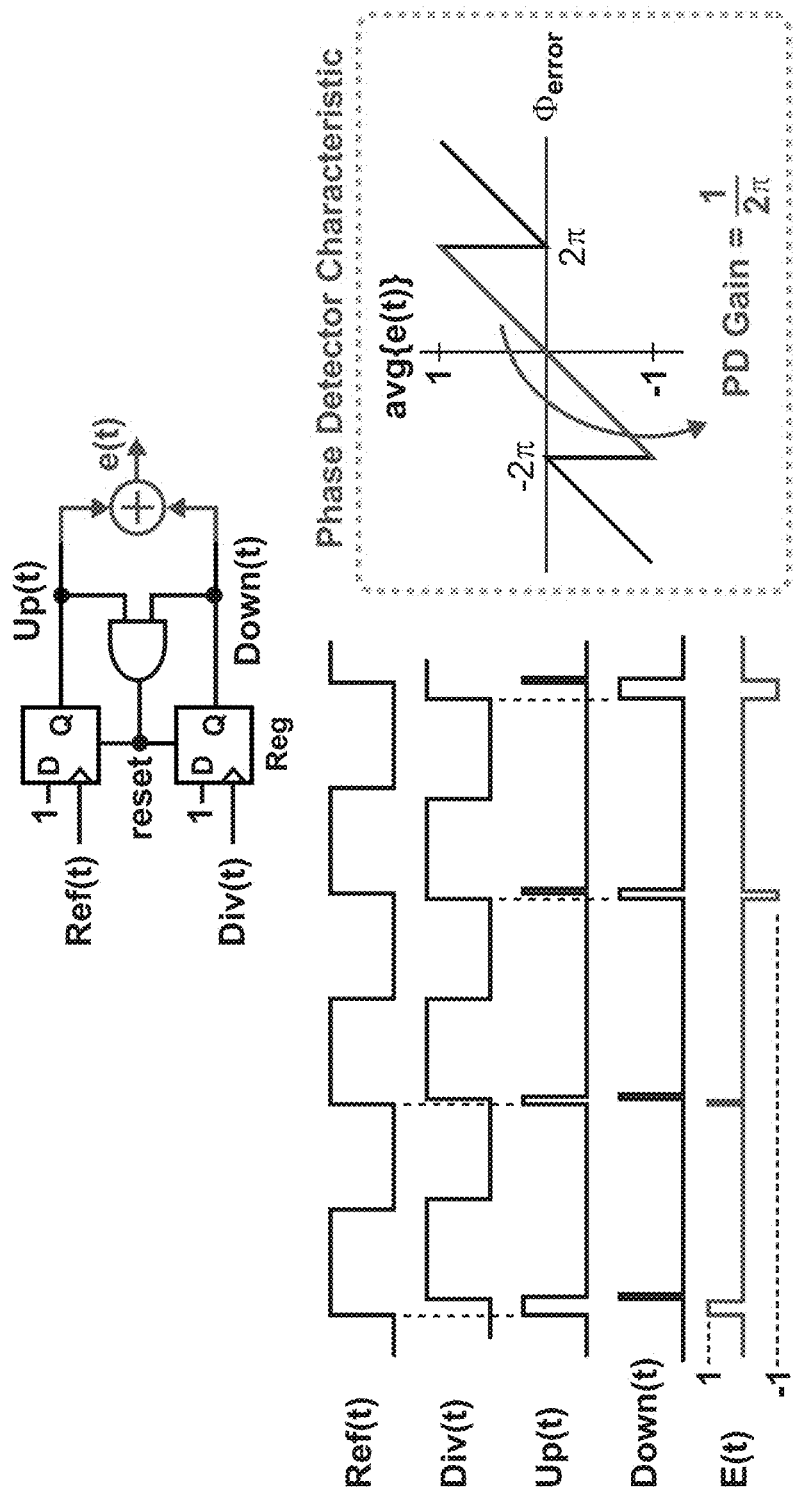
FIG. 7 illustrates a conventional tristate PFD and corresponding signals and phase detector characteristic.

To provide a baseline understanding of how the PD gain will be increased in the proposed PD designs, we first examine the PD gain of the classical tristate PFD shown in FIG. 7. As mentioned earlier, the PD characteristic may be computed by sweeping the phase error across difference values and then computing the average of the error signal, e(t), for each value. As shown in FIG. 7, the resulting PD characteristic is actually nonlinear in practice, but we can approximate it as linear under the assumption that the PLL is in lock and the instantaneous phase variations due to noise and other perturbations are quite small. Therefore, in one embodiment, the PD gain is simply calculated as the slope of the PD in the vicinity of zero phase error, which yields a value of $1/(2\pi)$ for the tristate PD.

Figure 8A:
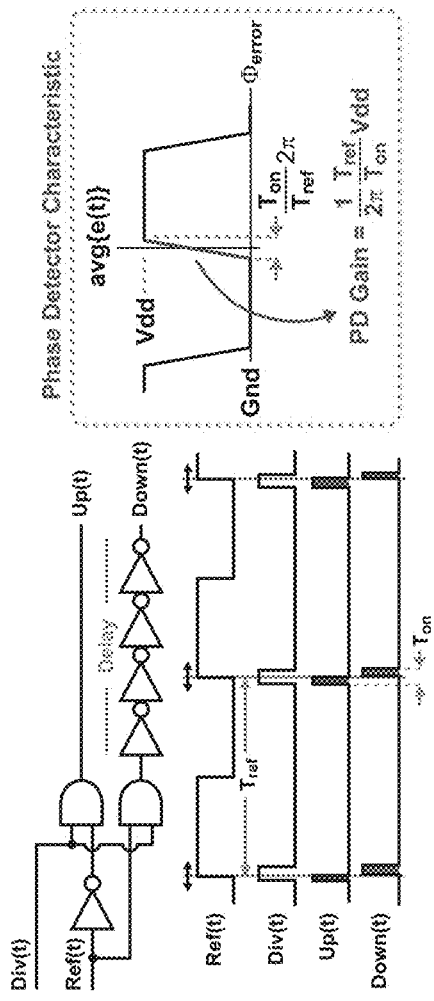
FIGS. 8A and 8B illustrate exemplary embodiments of phase detector circuitry according to certain aspects of the present inventions including, for example, high gain phase detectors for the switched resistor loop filters of FIGS. 5A and 5B notably, FIG. 8A may be characterized as a high speed phase detector which may be implemented in conjunction with, for example, the loop filter FIG. 5A, and FIG. 8B may be characterized as a multi-phase phase detector which may be implemented in conjunction with, for example, the loop filter FIG. 5B.
Figure 8B:
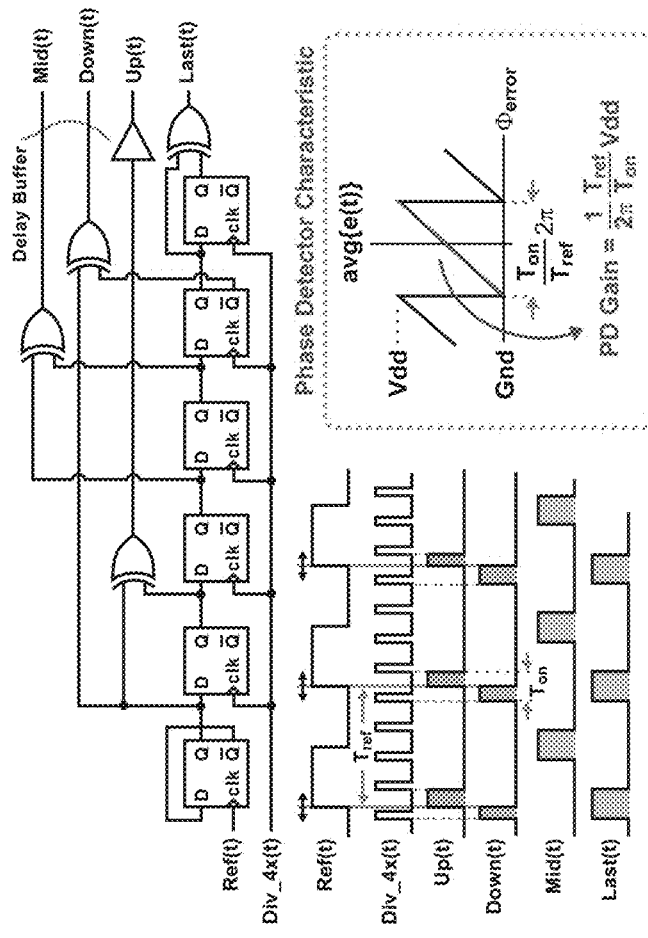

FIG. 8 illustrates two proposed high gain PD structures that are well suited for the proposed switched resistor loop filters shown in FIGS. 5A and 5B. The structure shown in FIG. 8A is well suited for the loop filter in FIG. 5A due to the fact that its minimal circuit complexity allows a high reference frequency to be used, and the net delay through the structure is minimal so that a high PLL bandwidth can be supported. Note, in this embodiment, the delay shown in FIG. 8A need only be long enough to guarantee non-overlapping pulses in asserting the Up and Down signals. In contrast, the structure shown in FIG. 8B is well suited for the loop filter in FIG. 5B due to its support of multi-phase pulsing of the various switching signals in that loop filter. As stated earlier, the multi-phase switching technique reduces the voltage ripple caused by the pulsing action of the phase detector before it influences the control voltage of the VCO, thereby providing substantial reduction of reference spurs.

A technique that is leveraged by the proposed high gain phase detectors is to reduce the input range in phase error that is required to sweep across the full output range of the PD output. As a baseline, consider that the classical tristate PD shown in FIG. 7 requires an input phase range of $4\pi$ to sweep across its full output range. In contrast, the PD shown in FIG. 8A reduces this range according to the ratio of the pulse width of the divider output to the period of the reference frequency. Therefore, the shorter the divider output pulses, the higher the PD gain that can be achieved. As for the PD shown in FIG. 8B, the input phase range is reduced according to the ratio of the nominal period of the divider output to the period of the reference frequency. In the embodiment of the PD shown in FIG. 8B, the divider frequency is set to a nominal value that is four times higher than the reference frequency, so that the PD gain is increased by a factor of 4 compared to the classical tristate PD (assuming Vdd=1 V).

As revealed by the above discussions, the proposed PD structures achieve high gain by leveraging either (a) short pulses coming from the divider output (or reference output), or (b) a higher divider frequency than the reference frequency. In addition, one may want to the narrow the pulses further in the case of signal "Last(t)" shown in FIG. 8B in order to further boost the effective resistance of R3 within the loop filter shown in FIG. 5B. To efficiently implement such PD structures, one also needs to leverage appropriate techniques to create short pulses and/or leverage higher divider frequencies. We will address this issue in the next subsection.

A subtle issue that occurs in implementing a PD with such a narrow input phase range is that it can lead to longer or even dysfunctional behavior when performing initial frequency acquisition for the PLL. As such, a complementary frequency detection technique should be used in conjunction with the proposed high gain PD structures. We will discuss a proposed technique to achieve efficient frequency detection with these structures in a subsection to follow.

While exemplary phase detector embodiments are described and illustrated herein, it should be noted that other phase detector embodiments, structures, architectures and/or techniques, may be implemented in conjunction with the present inventions. Indeed, all phase detectors consistent with the present inventions, whether now known or later developed, are intended to fall within the scope thereof.

D. Considerations of Exemplary Divider Embodiments

In this section, we discuss various techniques related to the divider design and short pulse generation. The first subsection describes a known technique to generate short pulses from an asynchronous divider structure. The second subsection describes known techniques for supporting divider output frequencies that are higher than the reference frequency. Finally, the third subsection focuses on techniques for leveraging short pulse generation and sub-selection of pulses to generate pulse waveforms for a switched resistor element.

Notably, while exemplary divider circuitry embodiments, structures, architectures and techniques are described and illustrated in detail herein, for example, divider circuitry providing a division factor of 4, the present inventions are not limited to such exemplary embodiments, structures, architectures and techniques and/or any particular division factor. Indeed, all divider circuitry and/or techniques, whether now known or later developed (including, for example, division factors other than 4), may be implemented in conjunction with the present inventions and, as such, are intended to fall within the scope thereof.

i) Narrow Width Pulse Generation Using the Divider

Figure 9:
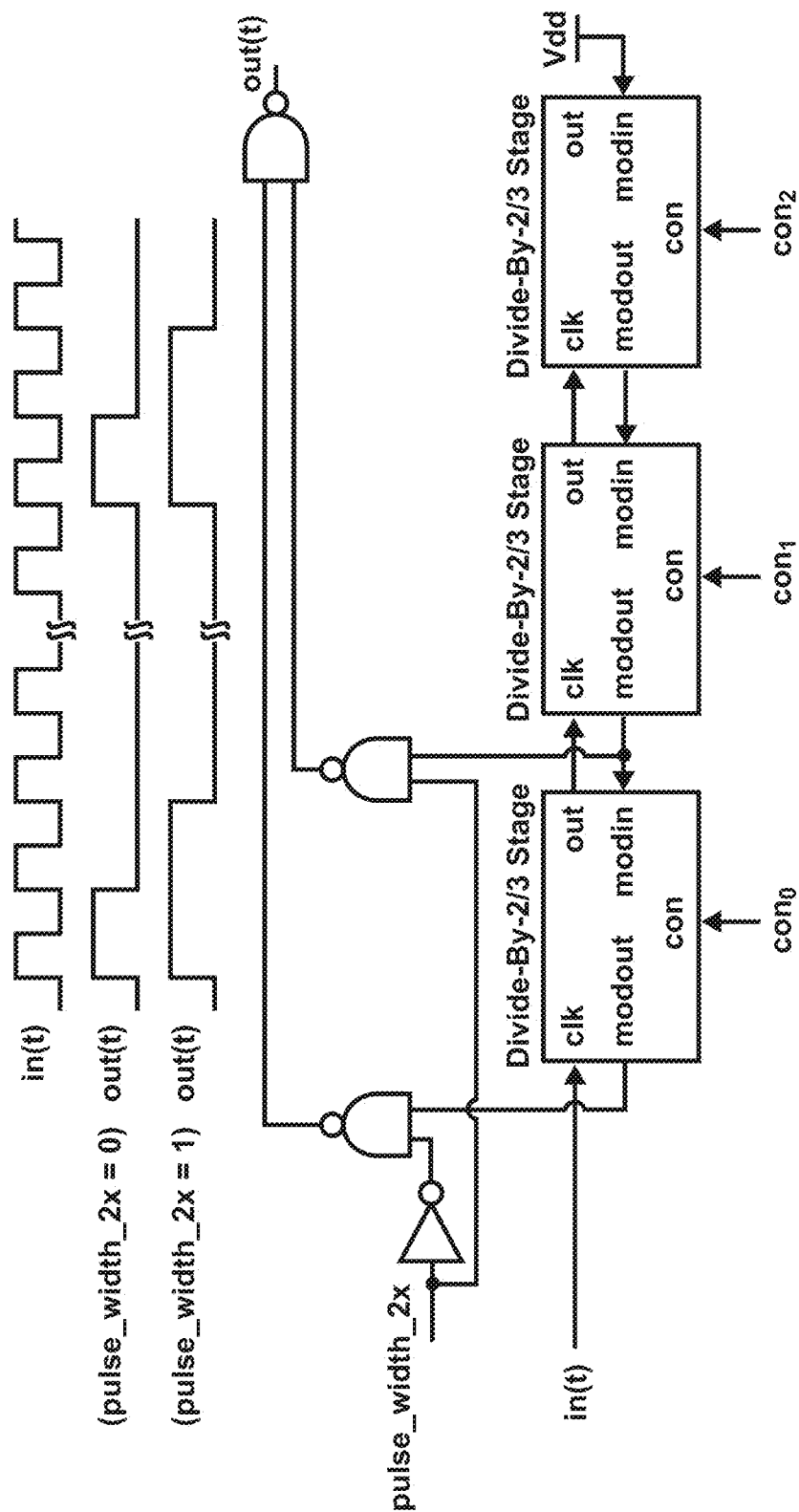
FIG. 9 illustrates an exemplary embodiment of asynchronous divider circuit and a technique of generating short output pulses therefrom, wherein the output pulses include a variable width.

FIG. 9 illustrates a technique of generating short output pulses from a commonly used asynchronous divider circuit. As shown in the figure, pulses whose widths are $2^n$ multiples of the input period, where n=0, 1, 2 . . . , can be readily tapped off from appropriate stages in the divider using gate logic. In the example shown in the figure, tapping the first divider stage yields output pulse widths of one input period, and tapping the second stage yields output pulse widths of two input periods. The advantage of this method of producing pulses is that excellent control is achieved of the pulse width since it is dependent to first order only on the input period, which is well controlled in the context of a PLL that is locked in steady-state. In contrast, pulse widths created by delay circuits, as discussed below, are much more sensitive to temperature and fabrication process variations, as well as supply voltage changes.

Figure 10:
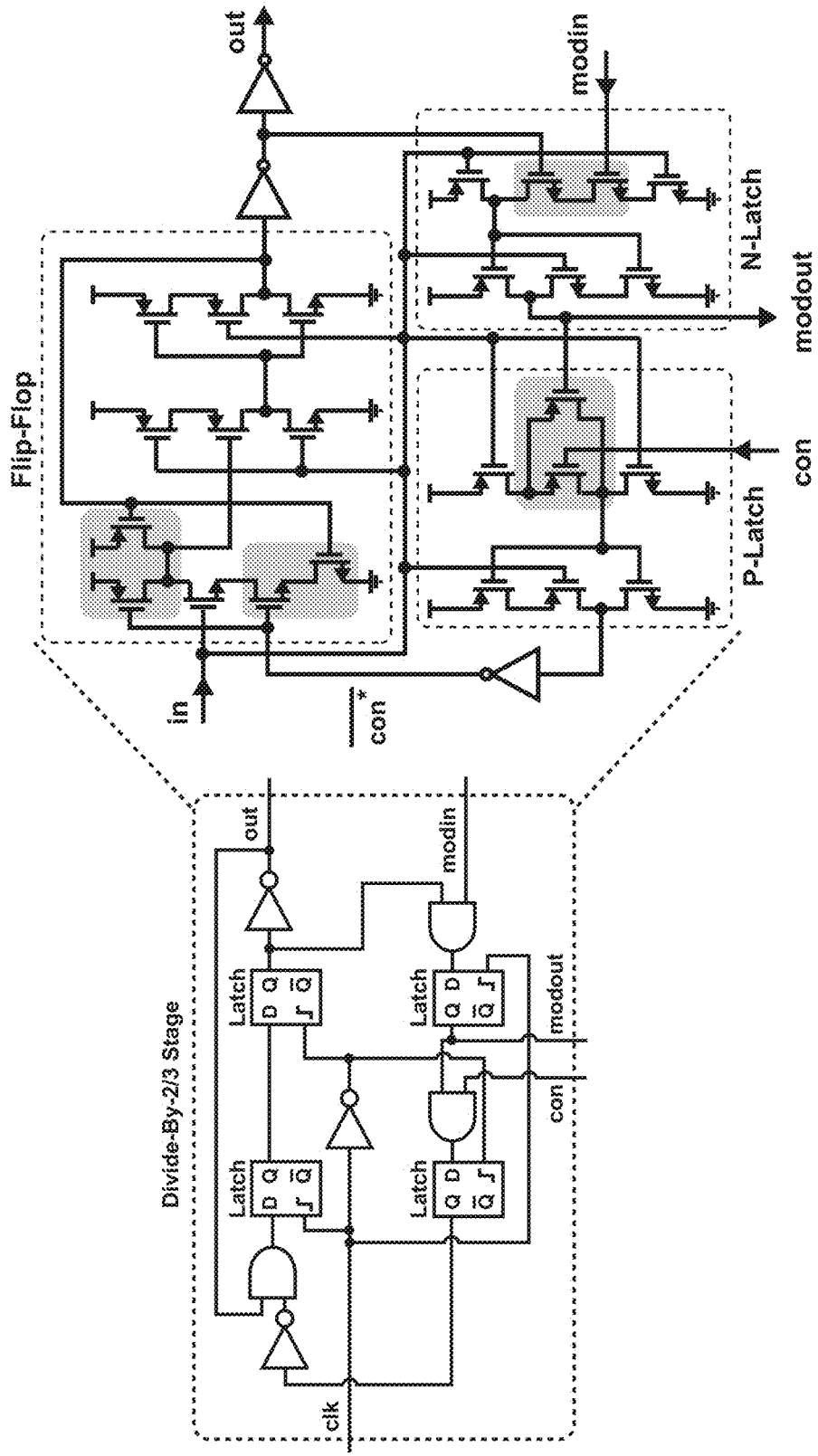
FIG. 10 illustrates a block diagram and gate and CMOS transistor level divide-by-2/3 stage asynchronous divider circuit.

FIG. 10 provides more detail on the Divide-by-2/3 stages that are used in the asynchronous divider structure shown in FIG. 9. We see that the stages are composed of a small number of gates and latches. The transistor level implementation shown in FIG. 10 shows an efficient implementation of the Divider-by-2/3 stages using CMOS devices.

ii) Using a Higher Frequency Divider Output

Figure 11:
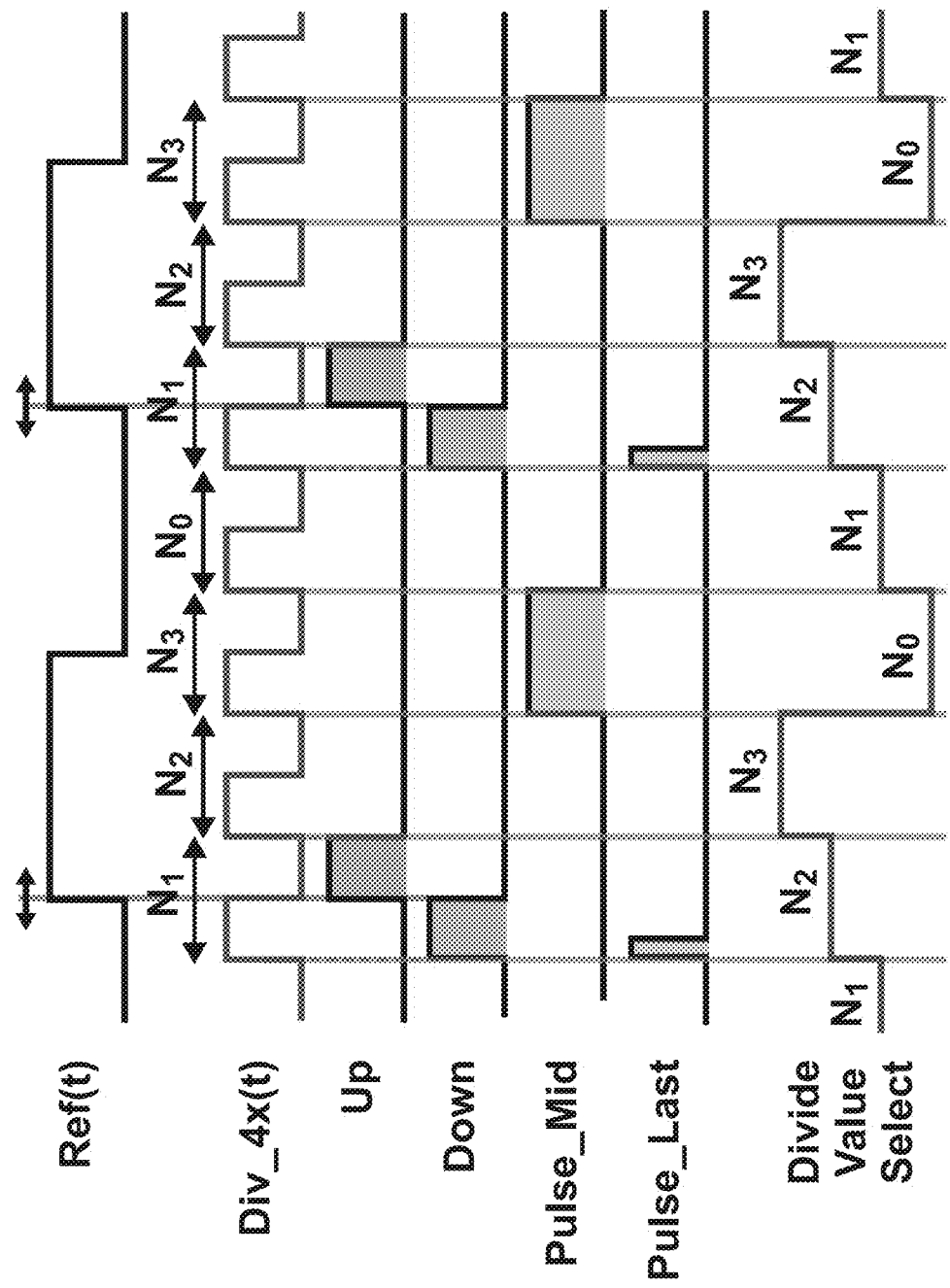
FIG. 11 illustrates the timing relationship of an asynchronous divider with four times the frequency of the reference for multi-phase pulse generation.

FIG. 11 shows the use of exemplary divider circuitry whose nominal output frequency is set to be four times that of the reference frequency. When using the divider output in combination with the PD shown in FIG. 8B, the various PD pulses are produced according to the rising edges of the divider and reference. Note that the details of generating the "Pulse_Last" waveform will be discussed in the next subsection.

In examining FIG. 11, note that comparison of the output reference and divider phases is performed through the Up and Down pulse generation, and that the remaining pulses of Pulse_Mid and Pulse_Last are used to gate the charge through the loop filter so as to significantly reduce reference spurs. As such, two out of every four divider edges are used for phase comparison, i.e., the edges adjoining the $N_1$ period shown in the figure. The effective divide value seen by the PLL, N, corresponds to the sum of the four divide periods that occur per reference period, i.e., $N=N_0+N_1+N_2+N_3$.

Figure 12:
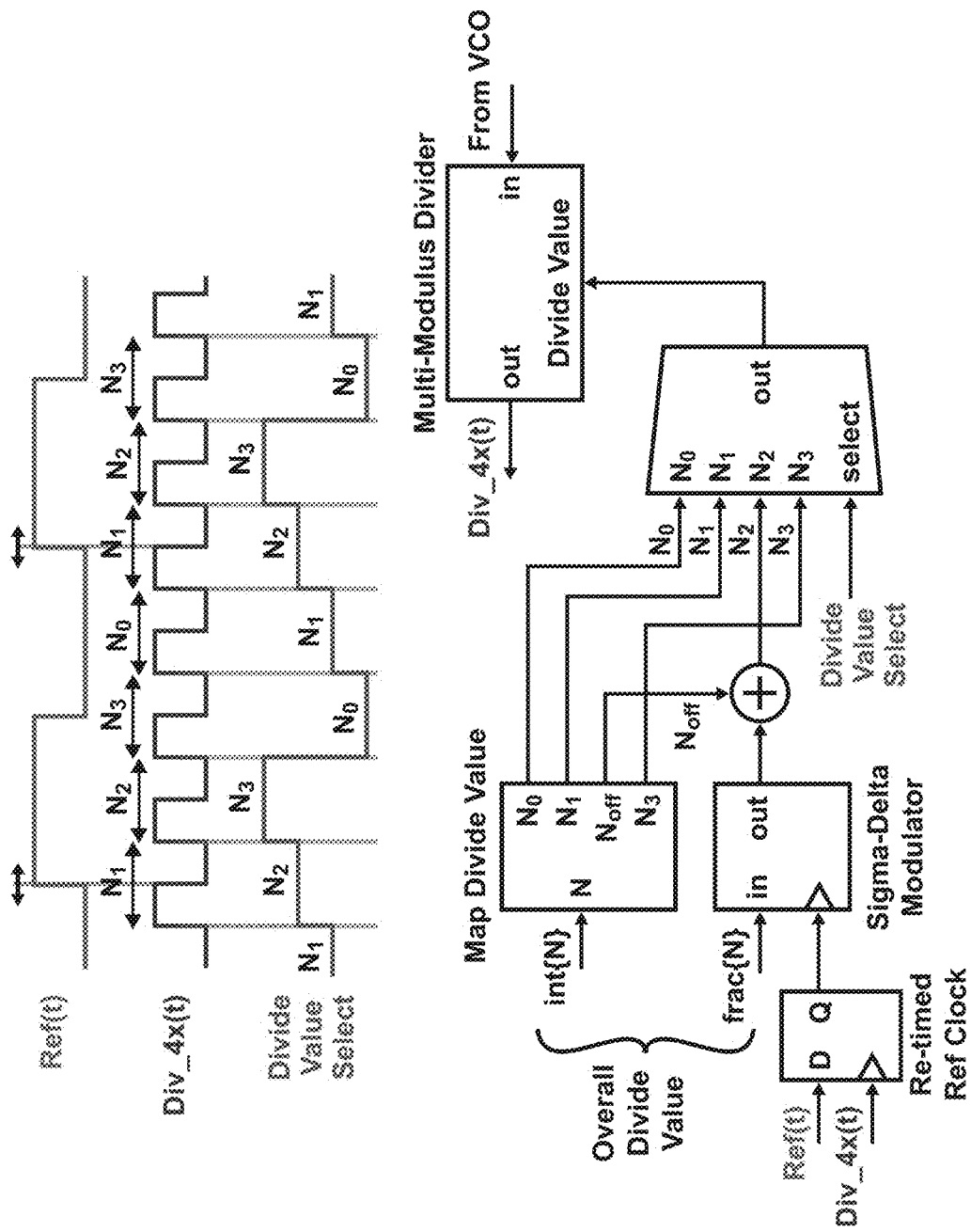
FIG. 12 illustrates an exemplary divider circuit and a method of controlling the four divide values to achieve a divide value of N.

FIG. 12 illustrates an exemplary method of controlling the exemplary four divide values to achieve a desired overall divide value of N. In this embodiment, the output of the divider is used to clock through different selection states of a digital multiplexer, which is fed the individual divider values of $N_0$ through $N_3$. For a given desired overall divide value, N, the integer portion is fed into digital mapping logic that determines the values of $N_0$, $N_1$, and $N_3$, and also sets an offset value $N_{off}$. The fractional portion of N is send into a Sigma-Delta modulator, which dithers its output such that its average corresponds to the desired fractional value. This dithered divide value is added to the computed offset, $N_{off}$, to form the value of $N_2$. Note that since the edge associated with the $N_2$ division value is not used to form the Up or Down pulses in the phase detector, the impact of Sigma-Delta dithering on generating additional divider noise is reduced.

Figure 13:
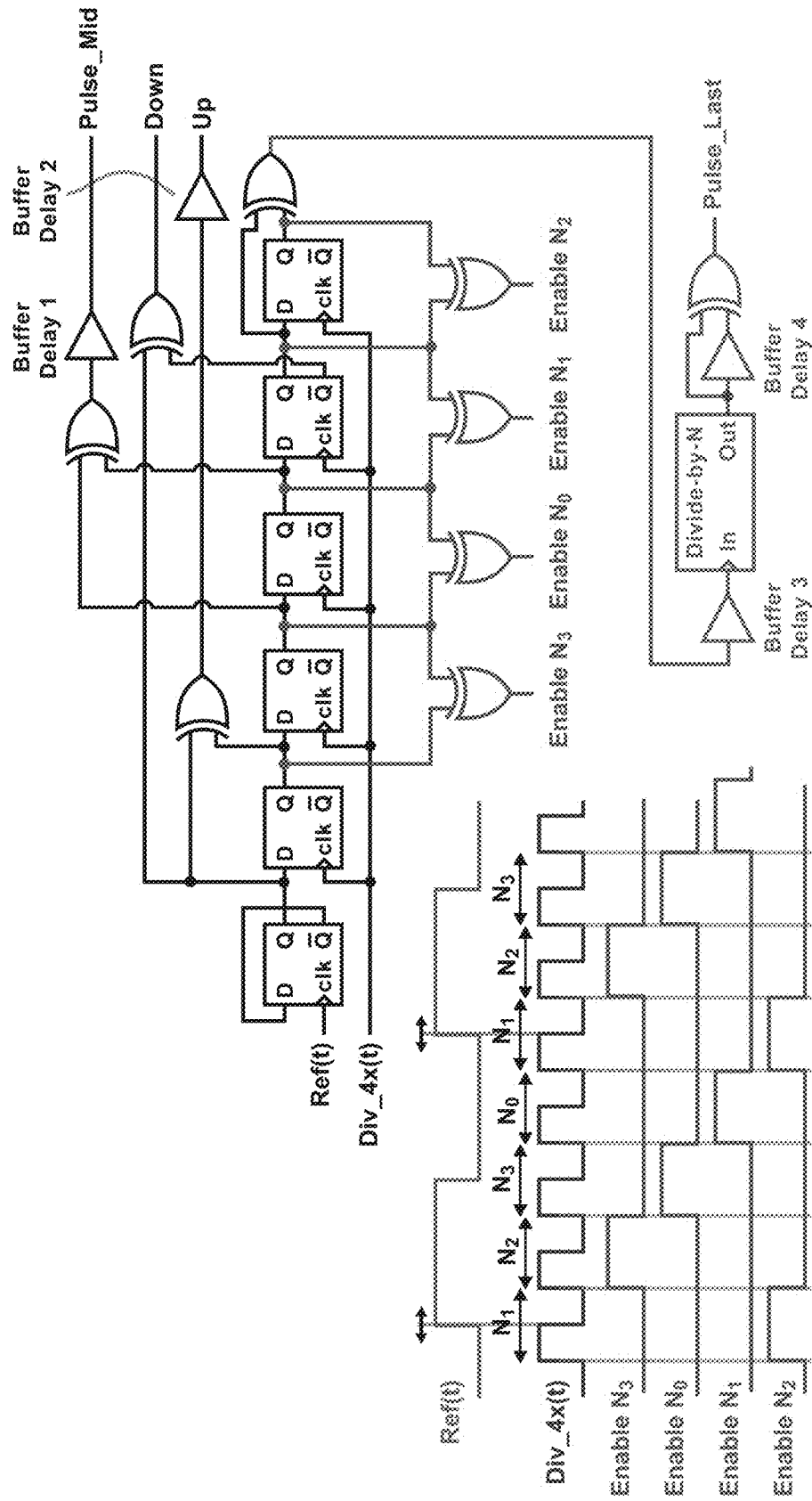
FIG. 13 illustrates an exemplary embodiment of multi-pulse phase detector circuitry to generate signals $N_0$ through $N_3$, notably, an advantage of this approach is that the divide values can be aligned as desired to their respective place within the reference period.

FIG. 13 shows one possible method to select each divide value $N_0$ through $N_3$ by leveraging the multi-pulse PD shown in FIG. 8B. As shown in the figure, a given divide value is selected when its respective enable pulse turns on. The advantage of this approach is that the divide values can be aligned as desired to their respective place within the reference period. For instance, as mentioned earlier, it is desirable to place divide value $N_2$, which is controlled by the Sigma-Delta modulator, away from both of the divider edges that influence the Up and Down pulses. Note that since there is an inherent delay in the divide operation, the enable pulses gate through a given divide value in the previous divider period.

iii) Additional Techniques for Pulse Generation

As described earlier in the text, the effective resistance value of a switched resistor is a direct function of the ratio of the period of switching versus the on-time of the switch. As such, a switched resistor PLL will often need to employ techniques to appropriately set both of these parameters so as to achieve the desired effective resistance. In the subsection, we explore this issue in the context of controlling the switching behavior of resistor $R_3$ in the example loop filter and multi-pulse PD circuits shown in FIGS. 5B and 8B, respectively.

Figure 14:
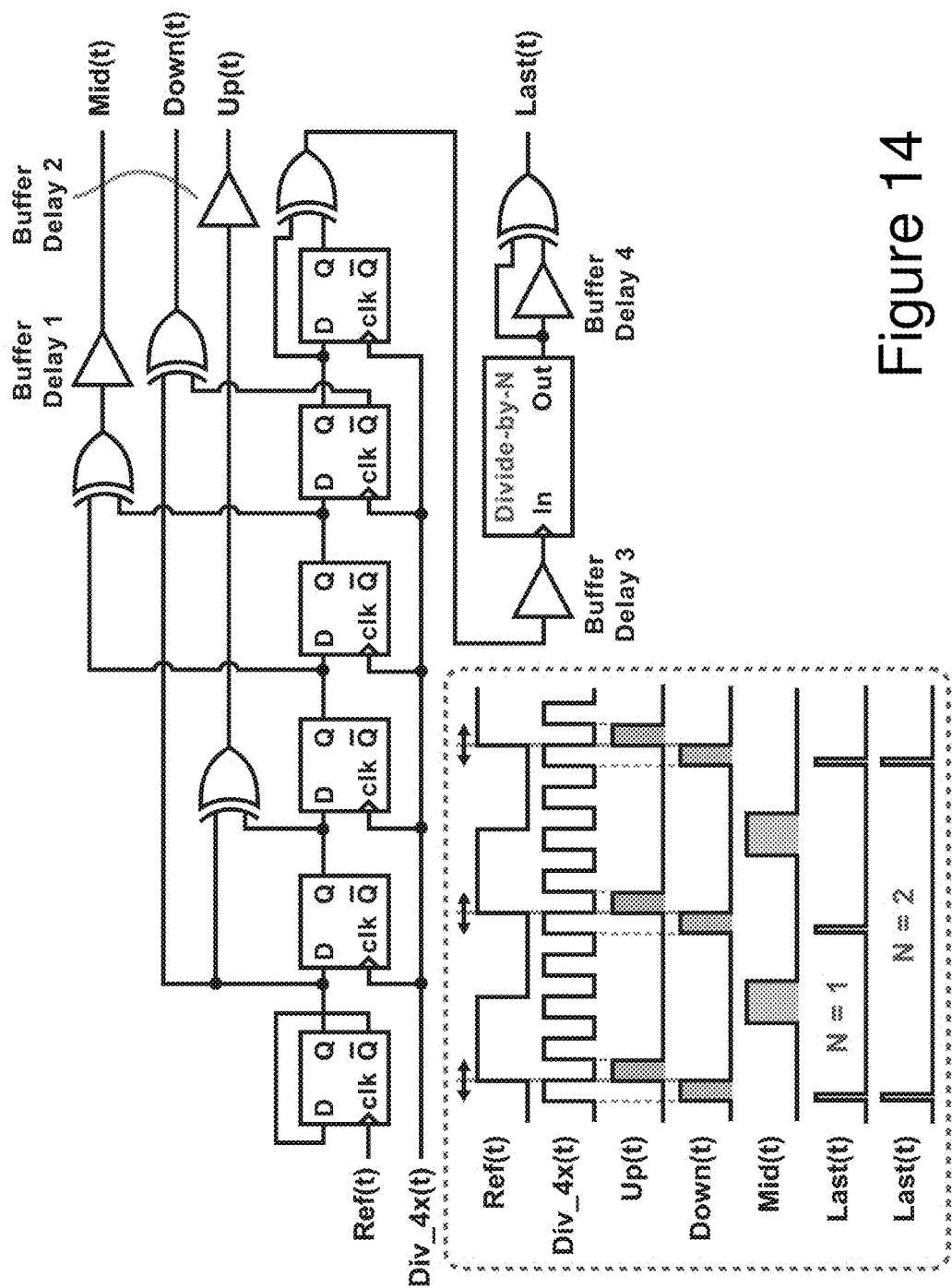
FIG. 14 illustrates an exemplary embodiment of circuitry including buffer delays to provide desired pulse widths and separation of the output signals, along with frequency division to control the period of a switching signal for a given resistor; notably, buffer delays 1, 2, and 3 are used to create separation between different pulse signals in order to provide non-overlapping behavior between the on-times of those pulses, whereas buffer delay 4 is employed to control the width of the pulses in the Last signal, and a divide-by-N circuit is used to set the period of those pulses in increments of the period of Up/Down pulses.

FIG. 14 illustrates the use of buffer delays to achieve desired pulse widths and separation, along with frequency division to control the period of a switching signal for a given resistor. In the figure, buffer delays 1, 2, and 3 are used to create separation between different pulse signals in order to guarantee non-overlapping behavior between the on-times of those pulses. A non-overlapping condition between Up and Down pulses is desirable so as to avoid shoot-through currents in their respective switches, which has the negative impact of increasing power consumption and adding variability in the effective gain provided by the PD. A non-overlapping condition between the Up/Down, Mid, and Last pulses is desirable so as to properly block ripple from previous loop filter stages from impacting the loop filter output (i.e., VCO input) so as to minimize reference spurs. Note that adding explicit delay buffers to the Mid and Last signals, as shown in the figure, may be unnecessary, for example, if a non-overlapping condition between the various pulses is met without such buffer delays.

In contrast to buffer delays 1 through 3, buffer delay 4 in FIG. 14 is used to control the width of the pulses in the Last signal, and a divide-by-N circuit is used to set the period of those pulses in increments of the period of Up/Down pulses. For the example shown in the figure, the Last pulses have much smaller width than that of the divider output, and period of the pulses is shown to be either the same (i.e., N=1) or twice as long (i.e., N=2) as the period of the Up/Down pulses.

Figure 15:
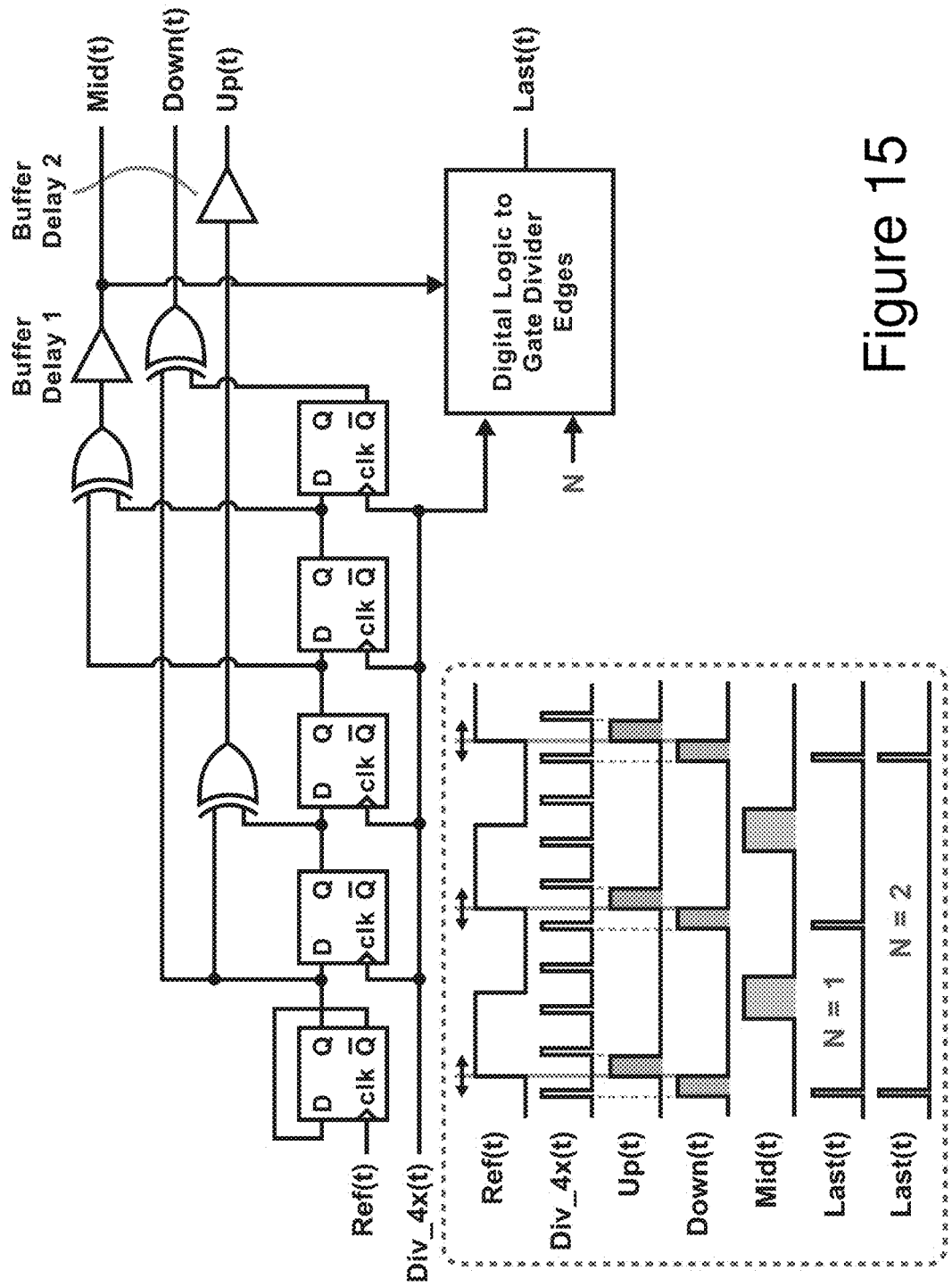
FIG. 15 illustrates an exemplary embodiment of circuitry including buffer delays to provide exemplary pulse widths and separation of the output signals, along with frequency division to control the period of a switching signal for a given resistor, notably, this circuitry generates multi-phase pulses in which the width of Last pulse corresponds to the pulse width of the divider output.

An alternative method of generating small pulse widths for the switching signals is to leverage the small pulses that can generated directly by the divider output as discussed earlier. In the example shown in FIG. 15, digital logic is leveraged to gate divider pulses to the Last signal at the appropriate phase (i.e., non-overlapping with the Mid signal) and period (i.e., integer multiples of the Up/Down period). Note that the pulses will, to first order, have the same pulse width in the Last signal as in the divider output. This technique has the advantage of achieving well controlled pulse widths that are largely independent of process and temperature variations since the divider output pulse widths are set by the period of its input signal, which is well controlled when the PLL is in lock.

Figure 33A:
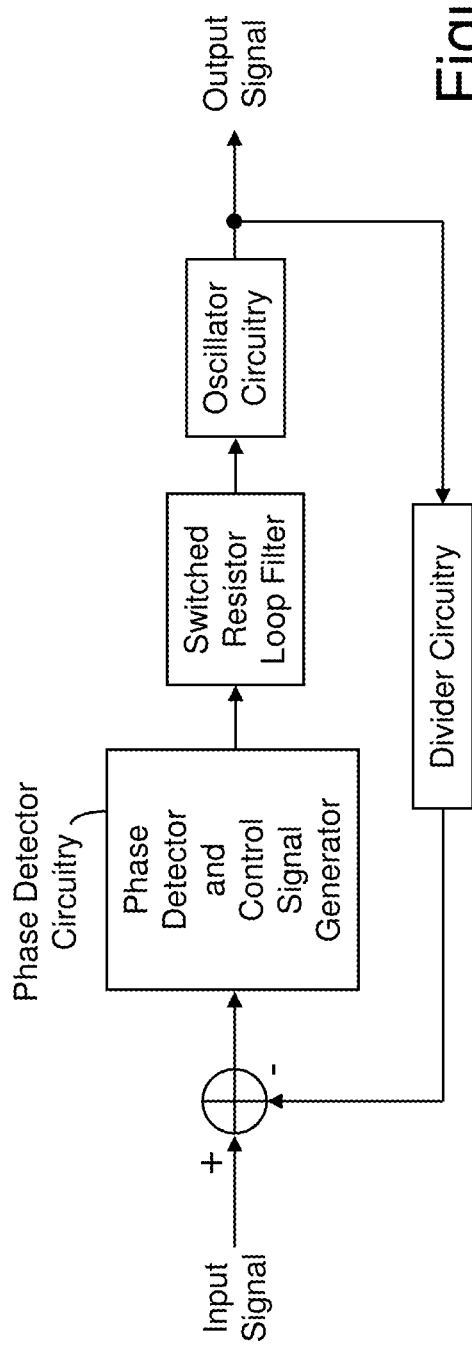
FIGS. 33A and 33B illustrate block diagram representations of exemplary embodiments of switched resistor phase-locked loop (PLL) structure/circuitry wherein control signal generator circuitry generates control or switching signals to control the effective resistance of the switched resistor network and/or the switched resistor loop filter, according to certain aspects of the present inventions; notably, the signal generator circuitry may be integrated in the phase detector circuitry (FIG. 33A) or separate from the phase detector circuitry (FIG. 33B).
Figure 33B:
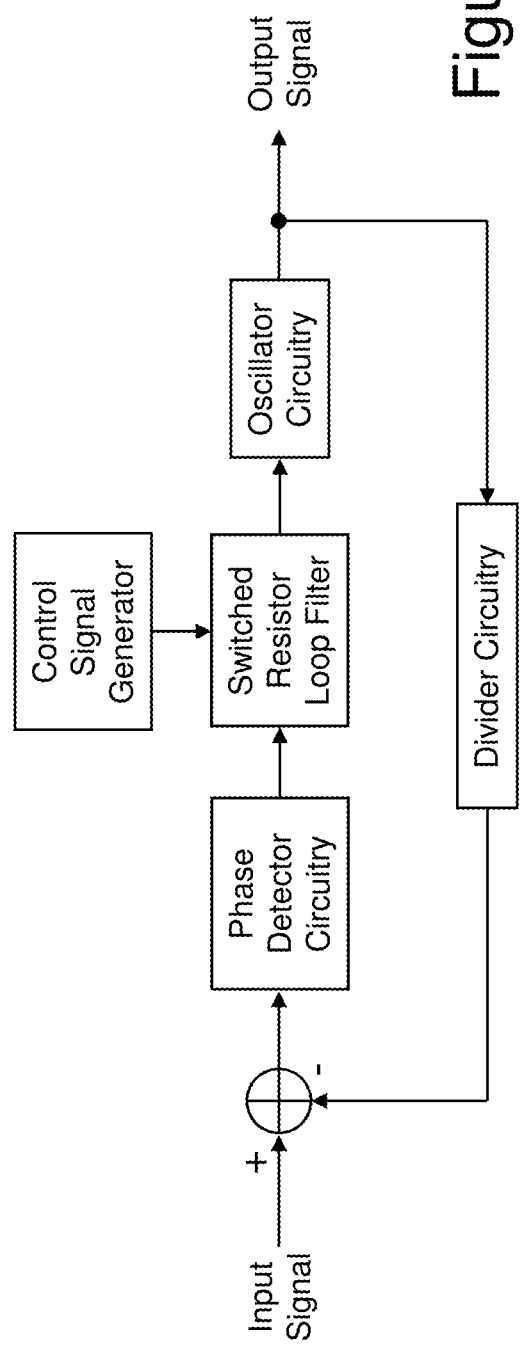

While exemplary techniques and circuitry for generating the signals for controlling the resistor network and/or switched resistor loop filter are described and illustrated herein, it should be noted that other circuitry, architectures and/or techniques, may be implemented in conjunction with the present inventions. Moreover, while the control or switching signals of several of the exemplary embodiments described and illustrated herein are generated by circuitry in the phase detector circuitry (see, for example, FIG. 33A), such signals may be generated by signal generator circuitry not in the phase detector circuitry (see, for example, FIG. 33B). Indeed, all circuitry, architectures and/or techniques for generating signals to control the resistor network and/or switched resistor loop filter, consistent with one or more aspects of the present inventions, whether now known or later developed, are intended to fall within the scope thereof.

Further, although exemplary circuitry, architectures and/or techniques illustrates periodic signal for controlling the resistor network and/or switched resistor loop filter, the control signal may be a non-periodic signal. Indeed, in one embodiment, a non-periodic signal may provide an effective resistance which is approximately achieved through proper choice of the average pulse width and average frequency of the pulse waveform. Thus, the signal to control the resistor network and/or switched resistor loop filter may be periodic, pseudo-periodic and/or non-periodic, all of which are intended to fall within the scope of the present inventions. For the sake of brevity, implementations of pseudo-periodic and/or non-periodic signals to control the resistor network and/or switched resistor loop filter are not discussed separately in detail but such implementations are quite clear from the text and illustration hereof.

E. Exemplary Frequency Detection Circuitry and Techniques

The present inventions may employ frequency detection circuitry. In this regard, as with most PLL implementations, frequency detection circuitry provides a lock condition for the PLL under starting conditions. A switched resistor PLL may employ a high gain PD. In one embodiment, we now propose frequency detection circuitry and techniques that provide robust methods of obtaining initial lock in the PLL without impacting the steady-state noise performance of the PLL.

Figure 16:
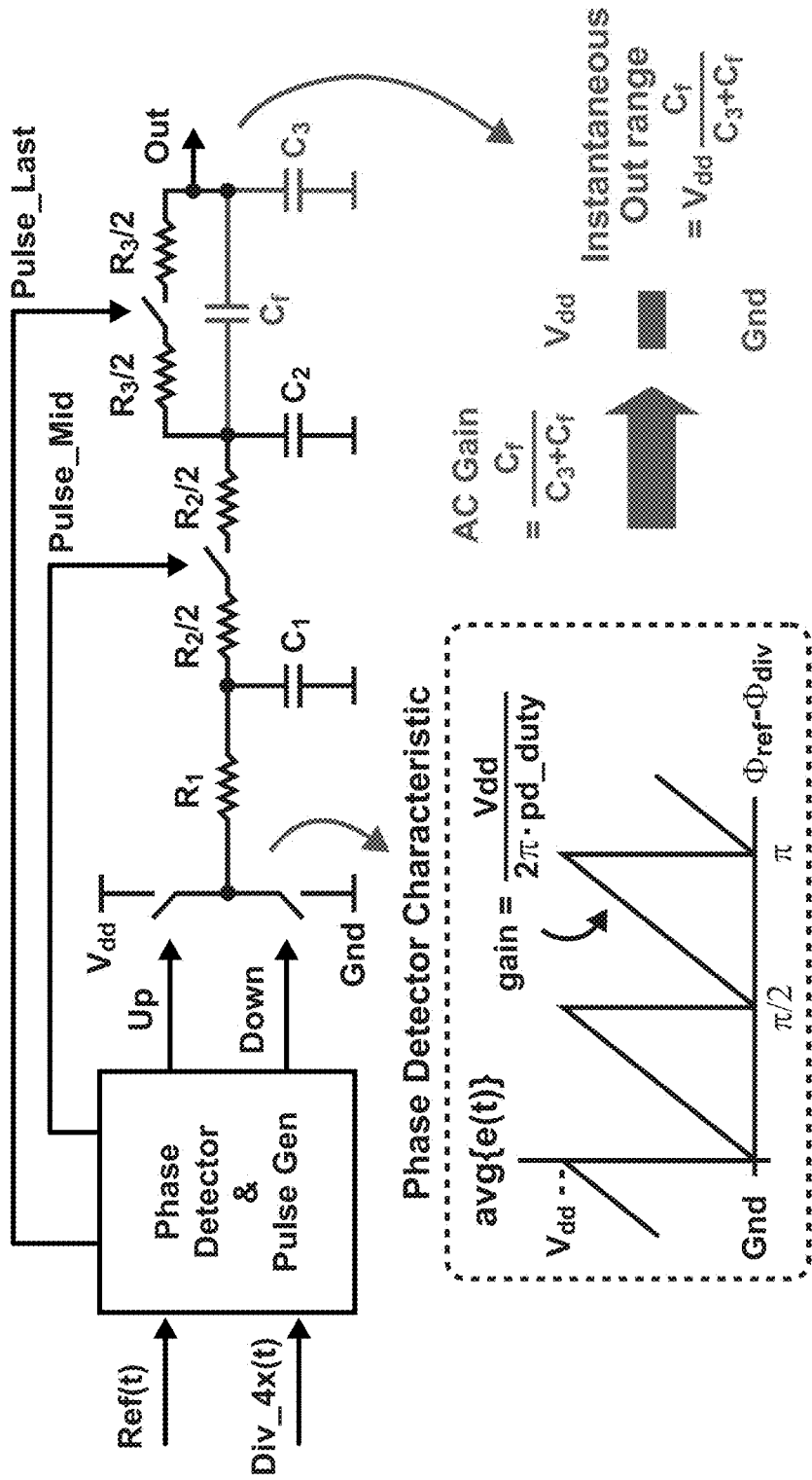
FIG. 16 illustrates an exemplary embodiment of frequency detection circuitry wherein a range of variation on the output voltage of the loop filter as the phase detector characteristic is swept through due to a frequency offset; notably, this circuit highlights the issues of using a switched resistor network in which high frequency attenuation occurs from the phase detector output to VCO tuning input.

FIG. 16 highlights issues of using a PD with increased gain when performing initial frequency acquisition in the PLL. The increased PD gain results in a reduced phase range over which the PD characteristic is linear. Since an offset in frequency between the reference and divider output causes a ramp in phase error, initial frequency acquisition will typically involve having the PD sweep through its PD characteristic at a rate that is in proportion to the amount of frequency error. A smaller linear phase range implies a faster effective traversal through the nonlinear regions of the PD for a given offset in frequency. For the given embodiment and assuming a relatively fast traversal through the PD characteristic, the impact of $R_3$ will be minimal such that the effective gain of the loop filter appears to be smaller than one (note that the max gain of the loop filter is its DC value of one).

As an example, FIG. 16 shows an embodiment where the effective gain of the loop filter is given by the ratio $C_f/(C_f+C_3)$, and we see that the relative perturbation of the voltage at the output of the filter is much smaller than the supply range. A concern of such a small voltage perturbation is that it may not include the required VCO voltage that corresponds to the desired output frequency, which directly compromises the goal of achieving frequency lock. In addition, the small linear PD range exacerbates the nonlinear behavior of the PD as frequency acquisition is occurring, which complicates the ability to achieve phase lock.

Figure 17:
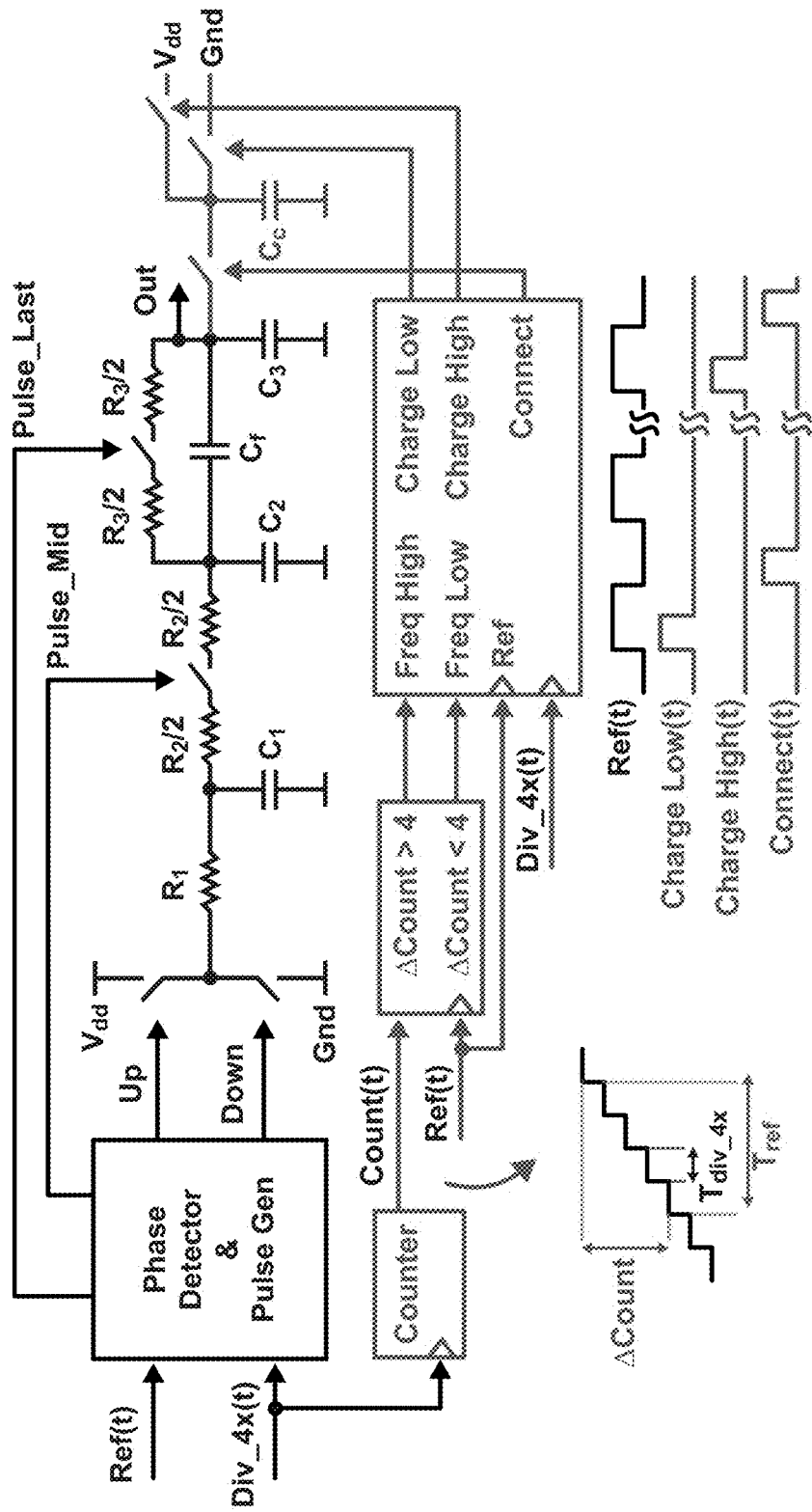
FIG. 17 illustrates an exemplary embodiment of frequency detection circuitry wherein a range of variation on the output voltage of the loop filter as the phase detector characteristic is swept through due to a frequency offset; notably, this exemplary frequency detection circuit and method employs edge count comparison between reference and divider output and a switched capacitor network to adjust loop filter output; moreover, the inventive circuitry and methods of frequency detection which employ a switched capacitor network as described and illustrated herein may be implemented in conjunction with a wide range of phase detectors and loop filters, including a switched resistor loop filter and high gain phase detectors as described and illustrated herein and conventional PLL loop filters and phase detectors including, for example, charge pump PLL loop filters and phase detectors.

Although conventional frequency detection circuitry and techniques may be suitable for a PLL including a resistor network and/or switched resistor loop filter, in one embodiment of the present inventions, the frequency acquisition circuitry and technique according to certain aspects of the present inventions provides relatively fast PLL locking without compromising the noise performance of the PLL when it is in lock. As shown in FIG. 17, the frequency detector circuitry includes digital logic that is used to compare edge counts of the reference and divider output and a switched capacitor network that is used to adjust the loop filter output based on the edge count comparison. In one embodiment, we are assuming that the frequency divider has a nominal output frequency that is four times the reference frequency when the PLL is locked. Therefore, an error in frequency can be detected by checking that four divider edges occur per reference period. In the situation where less than four divider edges occur per reference period, the implication is that the PLL output frequency is too low, whereas the situation where more than four divider edges occurring per reference period implies that the PLL output frequency is too high. A low or high PLL output frequency should be addressed by appropriately increasing or decreasing the loop filter output voltage. The proposed frequency detector performs this adjustment by charging a capacitor, $C_c$, to either the supply or ground and then connecting that capacitor to the loop filter capacitor at its output (i.e., $C_3$ in FIG. 17). As the loop filter capacitor, $C_3$, connects to $C_c$, its voltage is increased according to the ratio $C_c/(C_c+C_3)$ and the voltage on $C_3$ immediately prior to the connection.

Notably, there are several advantages offered by the frequency detector circuitry embodiment of FIG. 17. For example, first, the implementation may employ digital logic and a switched capacitor network. Second there is no static current required in any of its elements, which facilitates low power dissipation to be achieved. Third, the frequency detector elements are disconnected from the loop filter unless a frequency detection event occurs; in this way, the noise performance of the PLL will not be impacted once the PLL is locked. Fourth, the frequency detector may be always active, so if any unforeseen perturbation impacts the PLL such that it loses lock, frequency acquisition will occur such that lock is re-obtained. Finally, it is worthwhile to note that the method is not limited to having the nominal frequency correspond to four times the reference frequency. Rather, the nominal divider frequency can be any integer multiple, N, of the reference frequency, where is N>1, and the associated comparison count value may also be set to N. As an example, if the divider frequency were designed to have a nominal value that is N=8 times the reference frequency, then the output of the counter as shown in FIG. 17 may be compared to the value N=8 in determining whether there is a frequency error.

Figure 18:
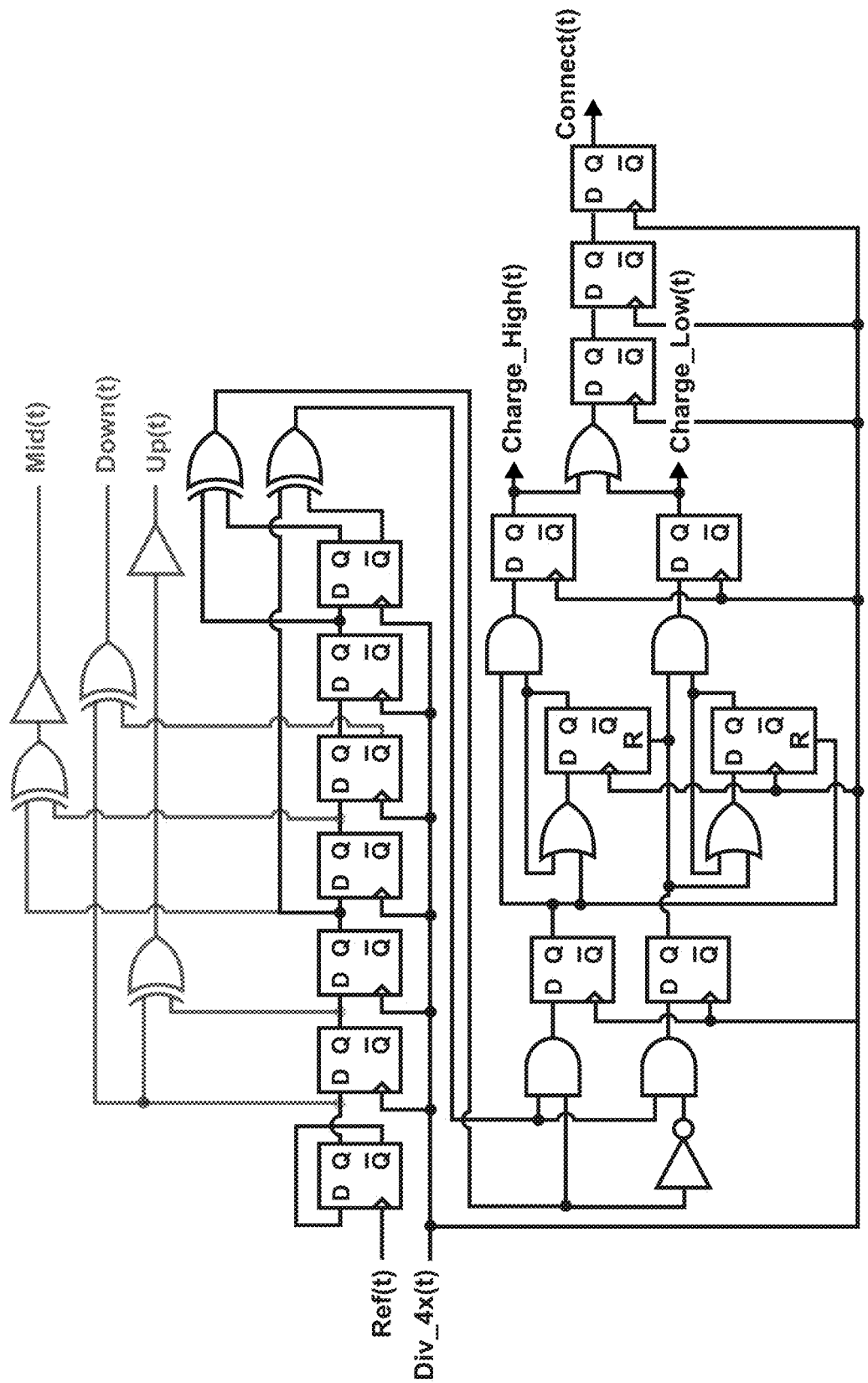
FIG. 18 illustrates an exemplary embodiment of frequency detector circuitry wherein the circuitry compares the edge locations of the reference as it propagates through cascaded registers which are clocked by the divider output; notably, this frequency detector circuitry may be well suited for the multi-pulse phase detector shown in FIG. 8B; it should also be noted that the frequency detection approach suggested in this figure may be implemented in conjunction with phase detectors other than those discussed and illustrated herein.

While FIG. 17 provides a framework for the proposed frequency detector implementation, the process of counting edges need not be restricted to explicit counter circuitry or structures. As an example, FIG. 18 shows an example of implementing the frequency detection logic by comparing the edge locations of the reference as it propagates through cascaded registers which are clocked by the divider output. Under lock conditions, edges of the reference should travel through four registers per reference period. By proper placement of the inputs of two XOR gates to the register chain, we can sense if the reference edges traveled through three registers per reference period (i.e., output frequency is too low) or five registers per reference period (i.e., output frequency is too high). The output(s) of the XOR gates are fed into adjoining logic to properly create the switched capacitor pulses, which should be designed to have non-overlapping characteristics.

Figure 19:
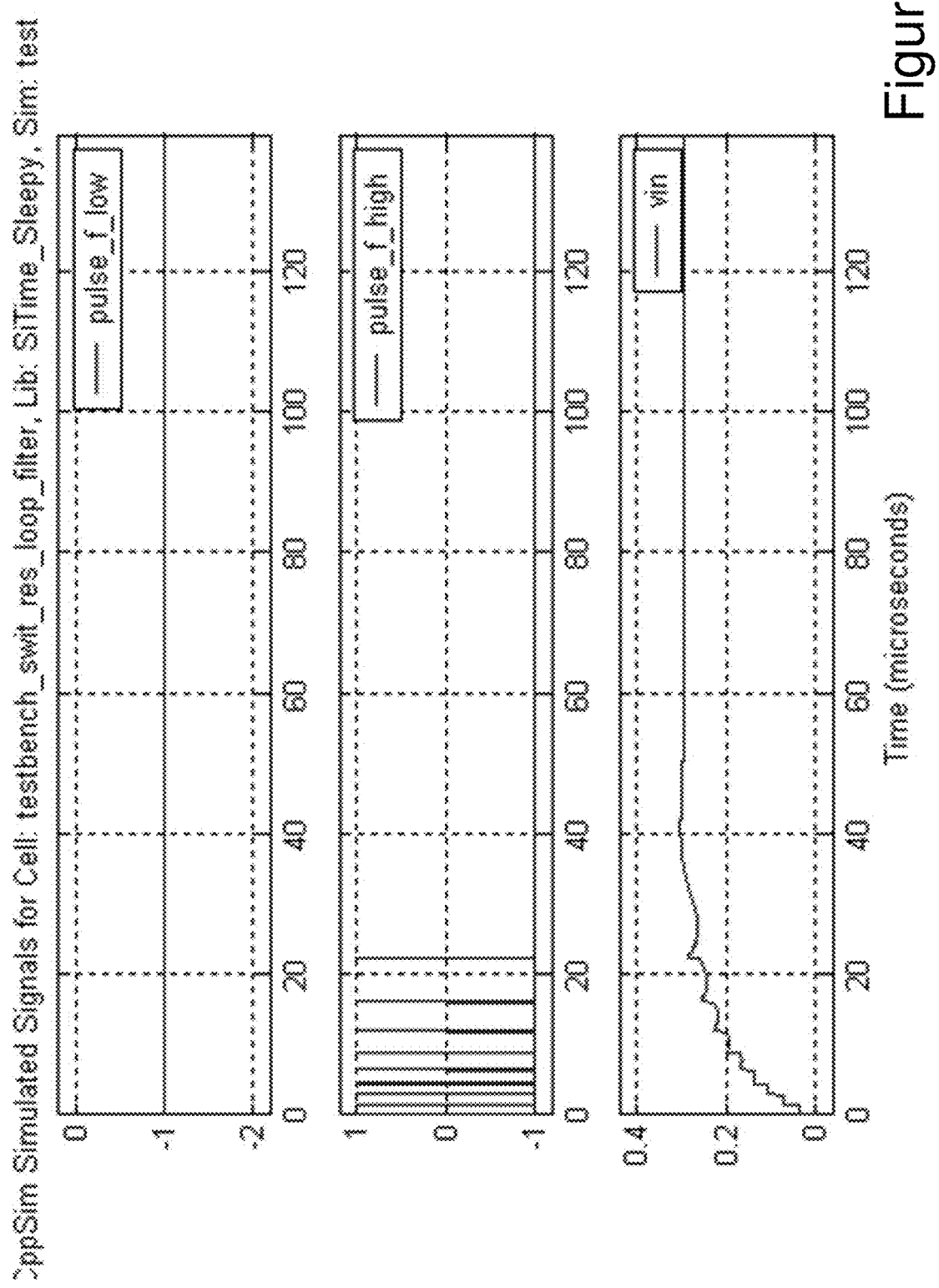
FIG. 19 illustrates a system level simulation of frequency acquisition of a switched resistor PLL using the frequency detector of FIG. 18.

FIG. 19 illustrates a system level simulation of frequency acquisition of a switched resistor PLL using the proposed frequency detector in FIG. 18. In this embodiment, the initial frequency of the PLL may be too low, so that several Charge_High(t) pulses (along with accompanying Connect (t) pulses, which are not shown in the figure) may be employed to charge up the loop filter output to the correct value. Once the PLL output frequency is close enough to its steady state value to avoid further cycle slipping, the frequency detector output pulses automatically stop and the phase detector becomes the sole means of feedback.

Figure 20:
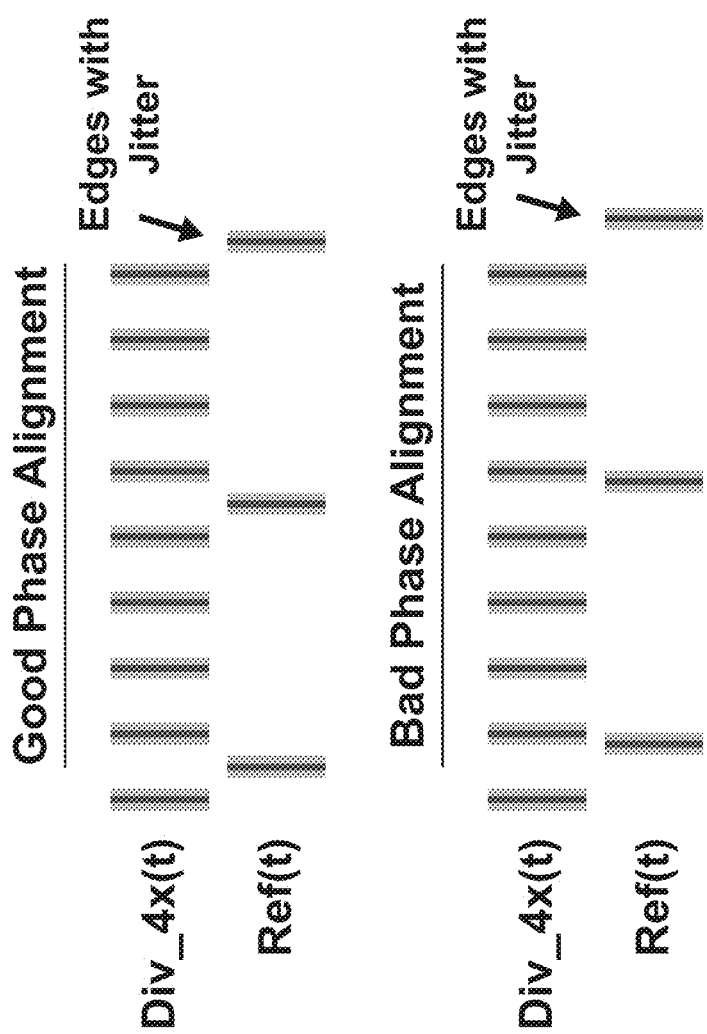
FIG. 20 illustrates good versus bad phase alignment between edges when counting edges for frequency detection.

An advantage of combining the frequency detector with the multi-pulse PD as shown in FIG. 18 is that it may enhance immunity of the frequency detector to falsely outputting frequency detection pulses to the switched resistor network. To explain, when comparing edge counts between the reference and divider outputs, one should take care to have proper phase alignment between the edges to avoid miscounts that could be falsely interpreted as frequency error. As shown at the top of FIG. 20, good phase alignment places the reference and divider edges sufficiently far from each other in phase (or time) so that the edge counting process yields instantaneous count values that match the average count value (i.e., four divider edges per reference edge in this example). As shown at the bottom of FIG. 20, bad phase alignment corresponds to the condition where jitter can alter the edge counting process so that the instantaneous count does not match the average count. In such case, false frequency detection signals will be generated which will significantly degrade the noise performance of the PLL. The advantage offered by the frequency detector in FIG. 18 is that the phase detector will insure proper phase alignment to avoid false frequency detection events.

Figure 21:
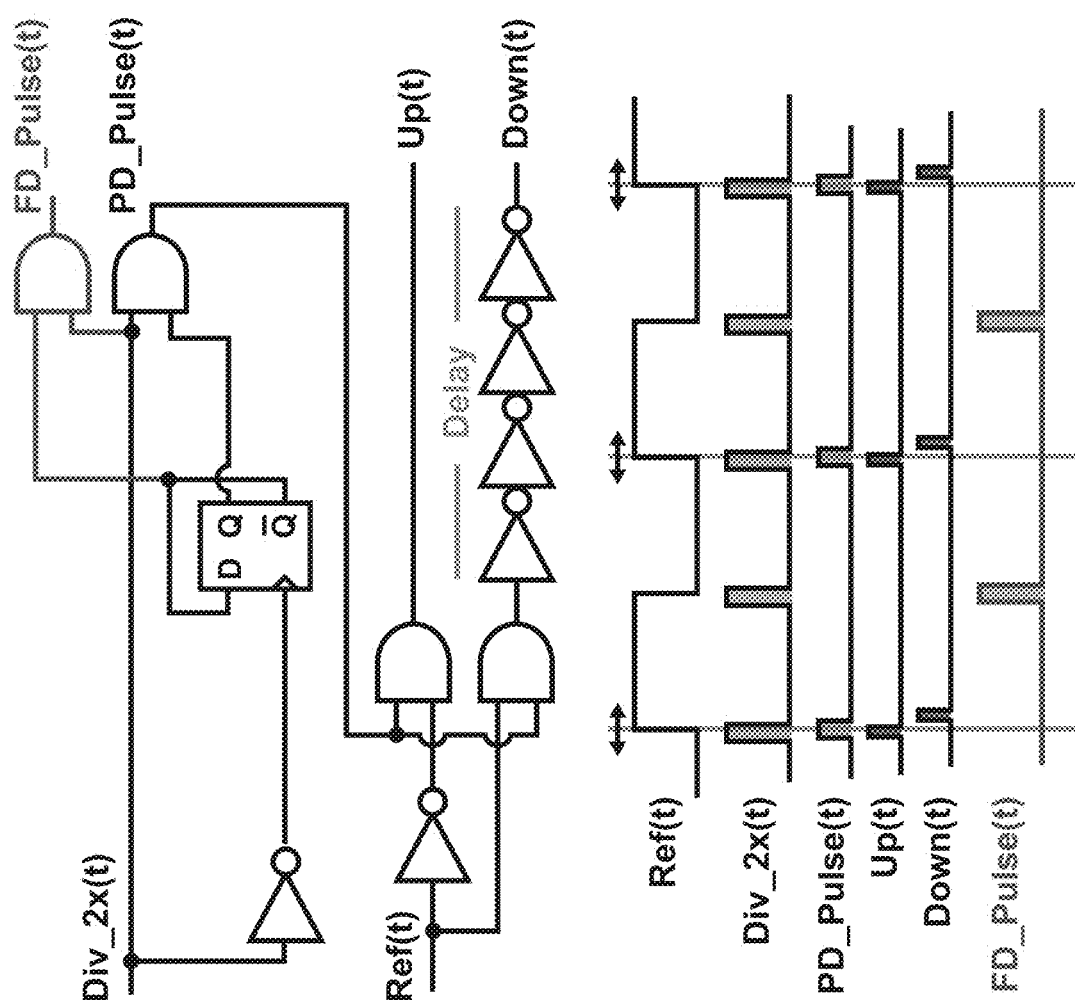
FIG. 21 illustrates an exemplary embodiment of phase detector circuitry (which is modified relative to the phase detector circuitry of FIG. 8A) which facilitates robust frequency detector edge counting.

Proper phase alignment for edge counting may also be accomplished with a simple modification of the phase detector structure shown in FIG. 8A. As shown in FIG. 21, if we design the divider such that its nominal frequency is twice that of the reference frequency, than we can gate its pulses such that half are used for phase detection and half are used for frequency detection (i.e., FD_Pulse in the figure). The benefit of the resulting frequency detection pulses are that they are placed relatively far away from the key reference edges, thus allowing a robust operation of counting edges.

Figure 22:
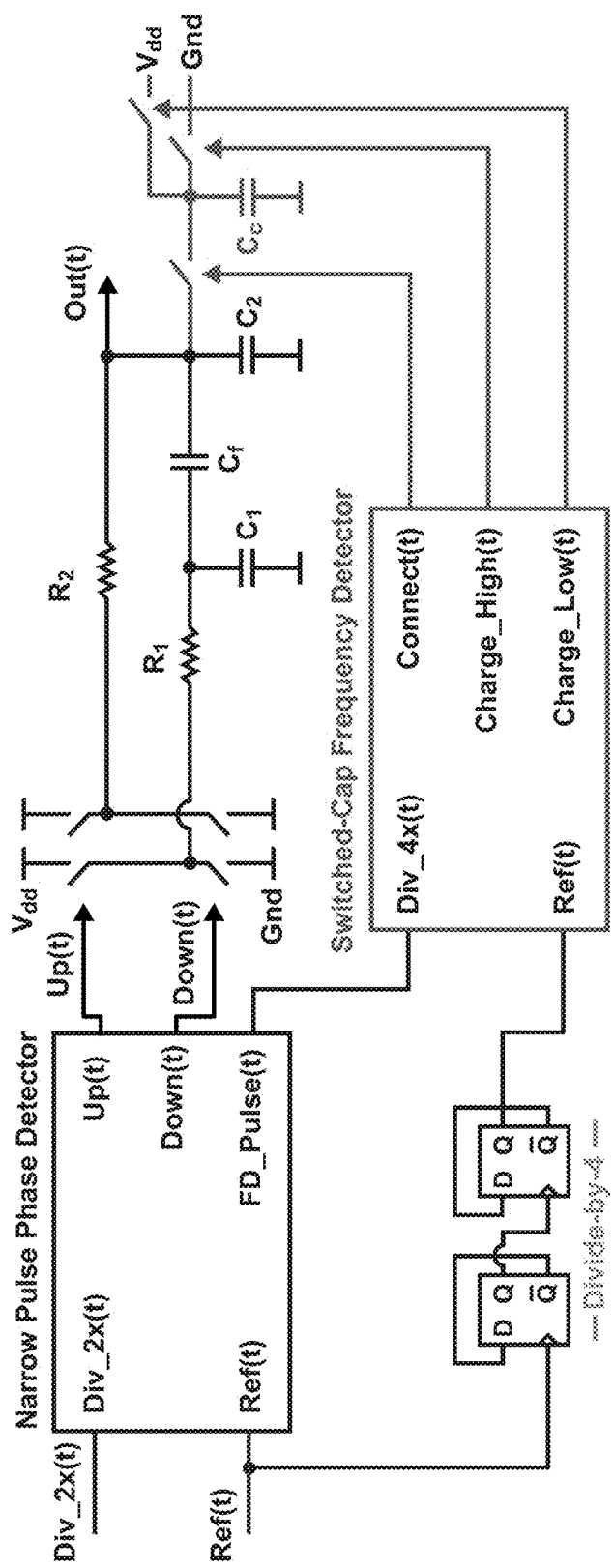
FIG. 22 illustrates the frequency detection logic/circuitry of FIG. 18 in combination with the phase detector and switched resistor loop filter circuitry of FIG. 21.

In the PD implementation shown in FIG. 21, the frequency detection pulses occur at the same frequency as the reference under lock conditions. However, although not necessary, it may be advantageous to utilize the same frequency detection logic as shown in FIG. 18 by simply dividing the reference frequency by four as shown in FIG. 22.

While exemplary inventive circuitry and techniques for phase detection are described and illustrated herein, it should be noted that other circuitry, architectures and/or techniques, may be implemented in conjunction with the present inventions—including, for example, conventional circuitry and techniques. Indeed, all circuitry, architectures and/or techniques consistent with one or more aspects of the present inventions, whether now known or later developed, are intended to fall within the scope thereof.

Moreover, while the switched capacitor frequency detection circuitry and techniques have been described and illustrated in conjunction with the switched resistor PLL circuitry and techniques of the present inventions, the inventive switched capacitor frequency detection circuitry and techniques may also be implemented in conjunction with conventional type PLL circuitry, for example, circuitry employing a charge pump circuit. Here, the inventive switched capacitor frequency detection circuitry and techniques facilitates rapid and robust lock condition of the inventive PLL circuitry as well as conventional PLL circuitry.

System Design Considerations of Exemplary Switched Resistor PLL Embodiments

In this section, we describe certain system level consideration related to design of a switched resistor PLL. The first subsection describes certain considerations related to modeling of the PLL dynamics. The second subsection describes modeling of noise in the switched resistor loop filter. The third subsection describes an issue of nonlinearity that should be considered in design of a switched resistor PLL. The fourth subsection describes a few practical issues such as enabling configurability in the switched resistor loop filter and the addition of VCO test mode circuits.

A. Modeling of Steady-State PLL Dynamics

Figure 23:
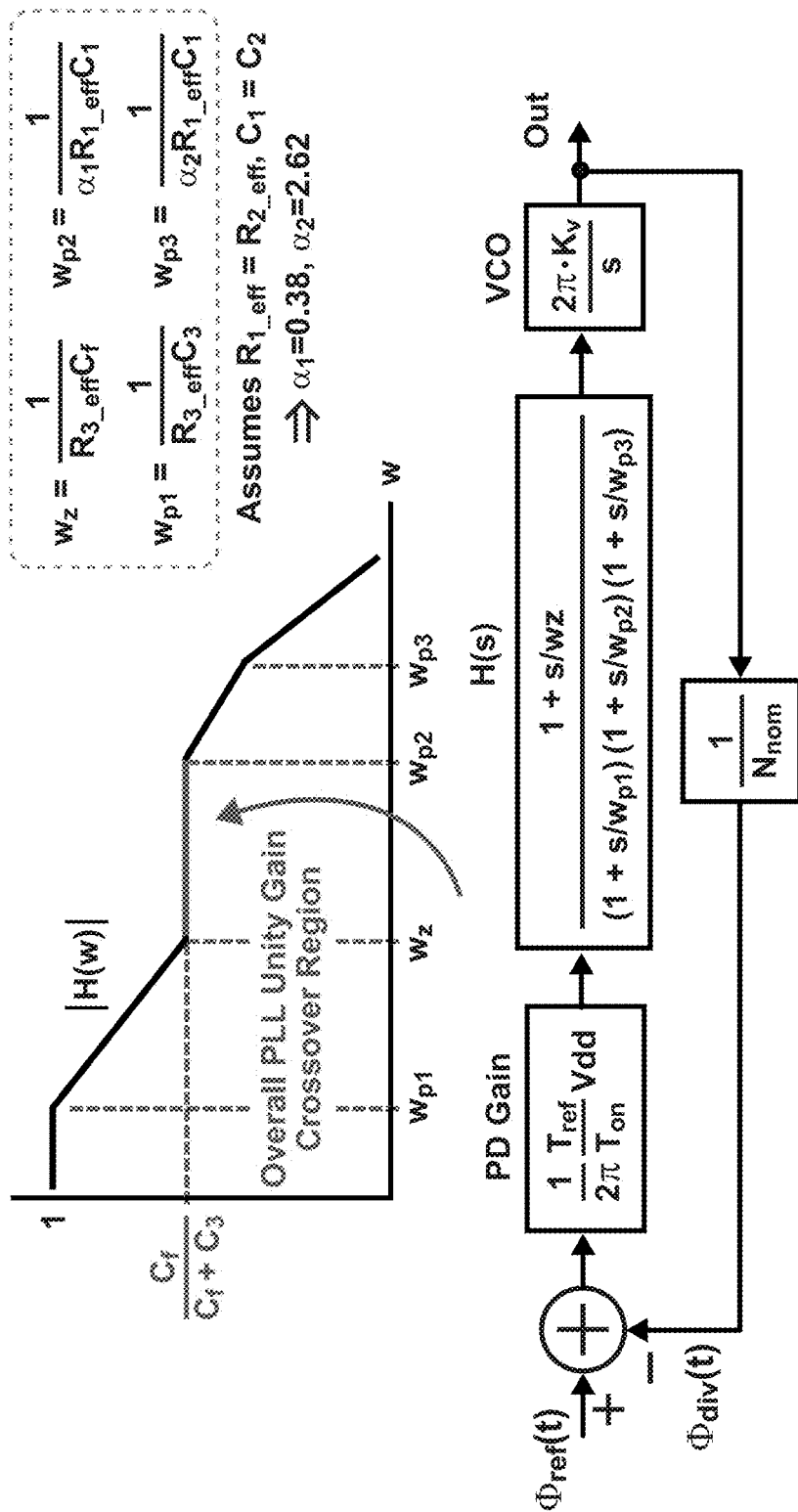
FIG. 23 illustrates a linearized model of a switched resistor PLL with a loop filter of FIG. 5B and a multi-pulse phase detector of FIG. 8B.

Modeling of the PLL dynamics of a switched resistor PLL may be similar to that of a classical analog PLL. In one exemplary embodiment, assuming that the PLL is in lock, the phase detector may be modeled as a linear gain factor as previously discussed, and the presence of the frequency detector can be ignored. As an example, FIG. 23 shows the linearized model of a switched resistor PLL with a loop filter as shown in FIG. 5B and a multi-pulse phase detector as shown in FIG. 8B. As indicated in the figure, the loop filter transfer function is composed of several poles and one zero, each of which can be calculated from the values of capacitance and effective resistance of the various loop filter elements. In certain embodiments, to achieve stability in the closed loop PLL response, the open loop gain of the PLL may be set such that there is adequate phase margin at the unity gain crossover of the overall PLL open loop transfer function. In general, a reasonable phase margin will be achieved when the unity gain crossover frequency occurs between the zero, $w_2$, and pole, $w_{p2}$, as indicated in FIG. 23.

B. Exemplary Noise analysis for Exemplary Switched Resistor PLL

Figure 24:
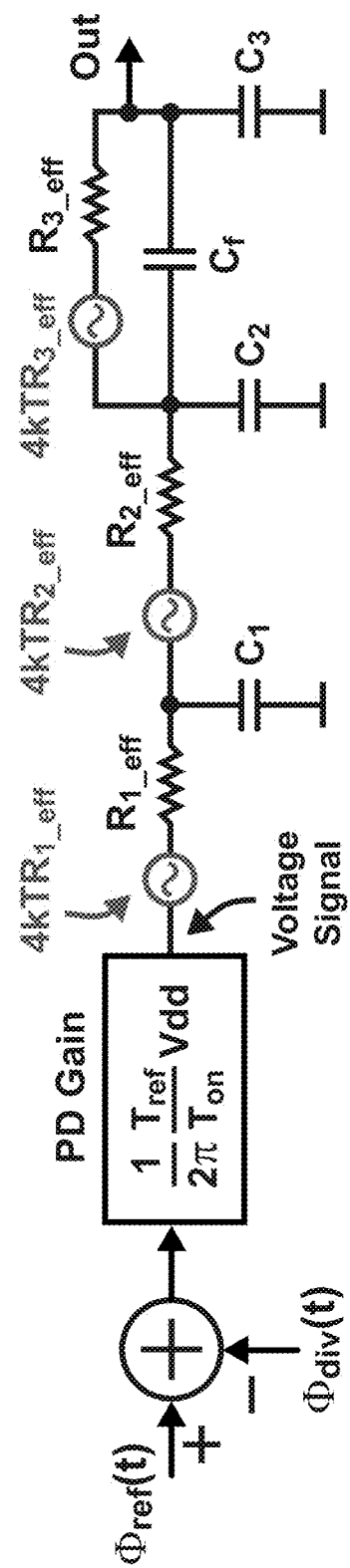
FIG. 24 is a representation of modeling of noise in a switched resistor loop filter.

Noise analysis of a switched resistor PLL may be performed in analogous fashion to that of a classical analog PLL. A distinguishing characteristic of a switched resistor PLL is the issue of how to model the impact of the switched resistor elements on the noise performance of the loop filter which implements the switched resistor network. As shown in FIG. 24, a first order approach to such analysis suggests the noise of each switched resistor is simply approximated as a white noise source that has variance $4kTR_{eff}$, where $R_{eff}$ is the effective resistance of the switched resistor element as discussed previously in this text. As such, note that the largest noise contributor in the loop filter will generally be the switched resistor element with highest effective resistance (i.e., $R_{3\_eff}$ for the example shown in FIG. 24). An assumption in this noise modeling technique is that the parasitic capacitance in each switched resistor element is negligible. If the parasitic capacitance is non-negligible, the switching operation will introduce kT/C noise whose effect should be quantified by performing transient noise simulations with a SPICE simulator.

Figure 25:
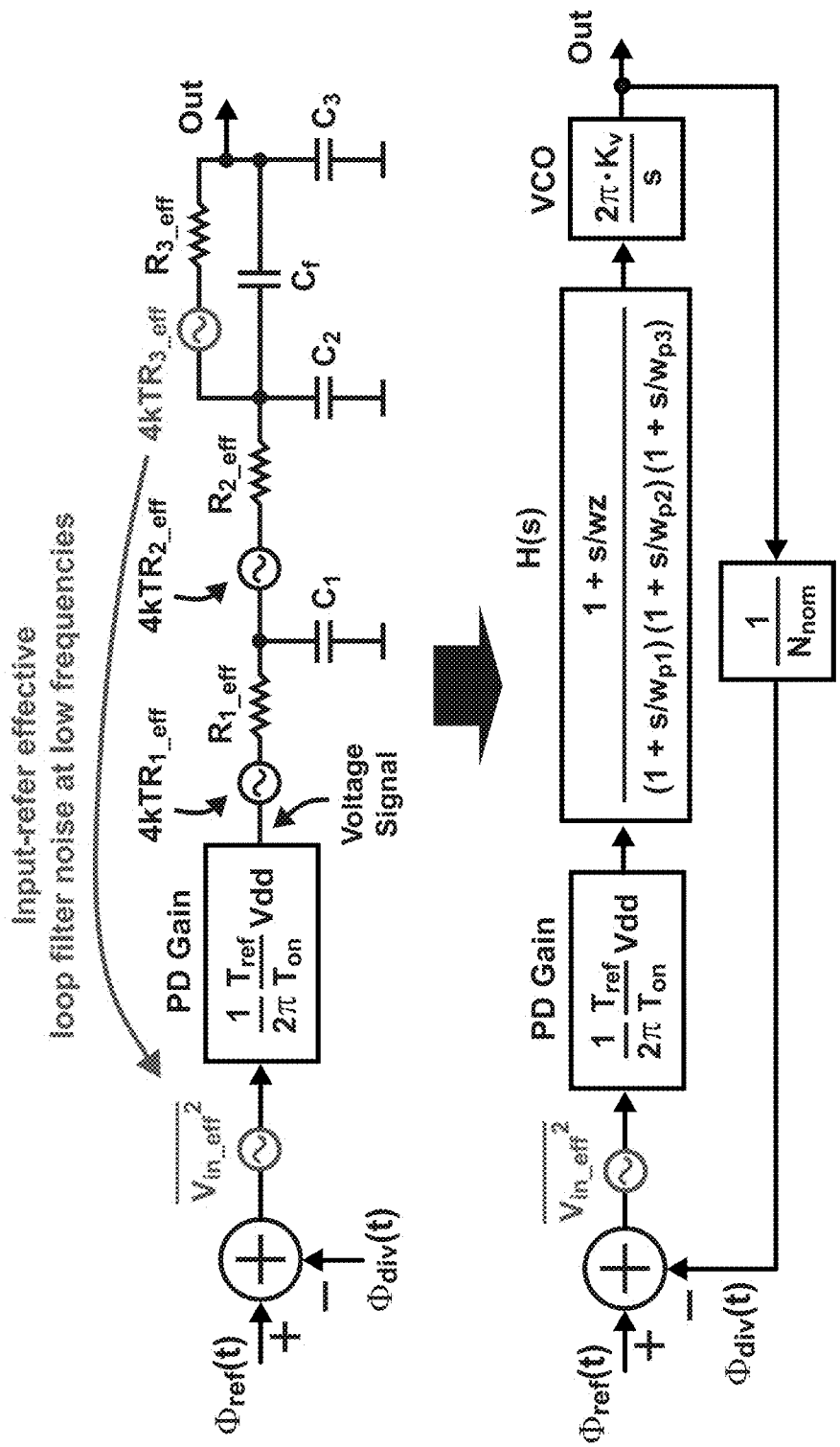
FIG. 25 is a block diagram representation of a noise analysis for a switched resistor PLL.

Given the noise sources assumed for each switched resistor, a first order hand analysis for estimating the impact of loop filter noise on the overall PLL noise performance can be performed by input referring the loop filter noise sources to the input of the phase detector, and then applying standard transfer function noise analysis on the overall PLL block diagram as shown in FIG. 25. For simplicity, the noise analysis can be focused on impact of the largest noise contributor (assumed to be the switched resistor corresponding to $R_{3\_eff}$ in the figure).

Notably, to implement a more thorough noise analysis, it may be preferable to construct a numerical model of the PLL in a program such as Matlab so as to see the impact of noise across a broad range of frequencies. Also, the impact of VCO and reference noise may be readily included in such an approach. An exemplary Matlab script performing this task is provided in Appendix 1 of the Provisional Application.

C. Nonlinear Effects

A subtle issue related to implementing the switched resistor PLL with the phase detector structures shown in FIG. 8 is the introduction of nonlinearity in the phase comparison path. The cause of this nonlinearity is generally attributed to the voltage dependent charging characteristic of the switched RC network.

Figure 26:
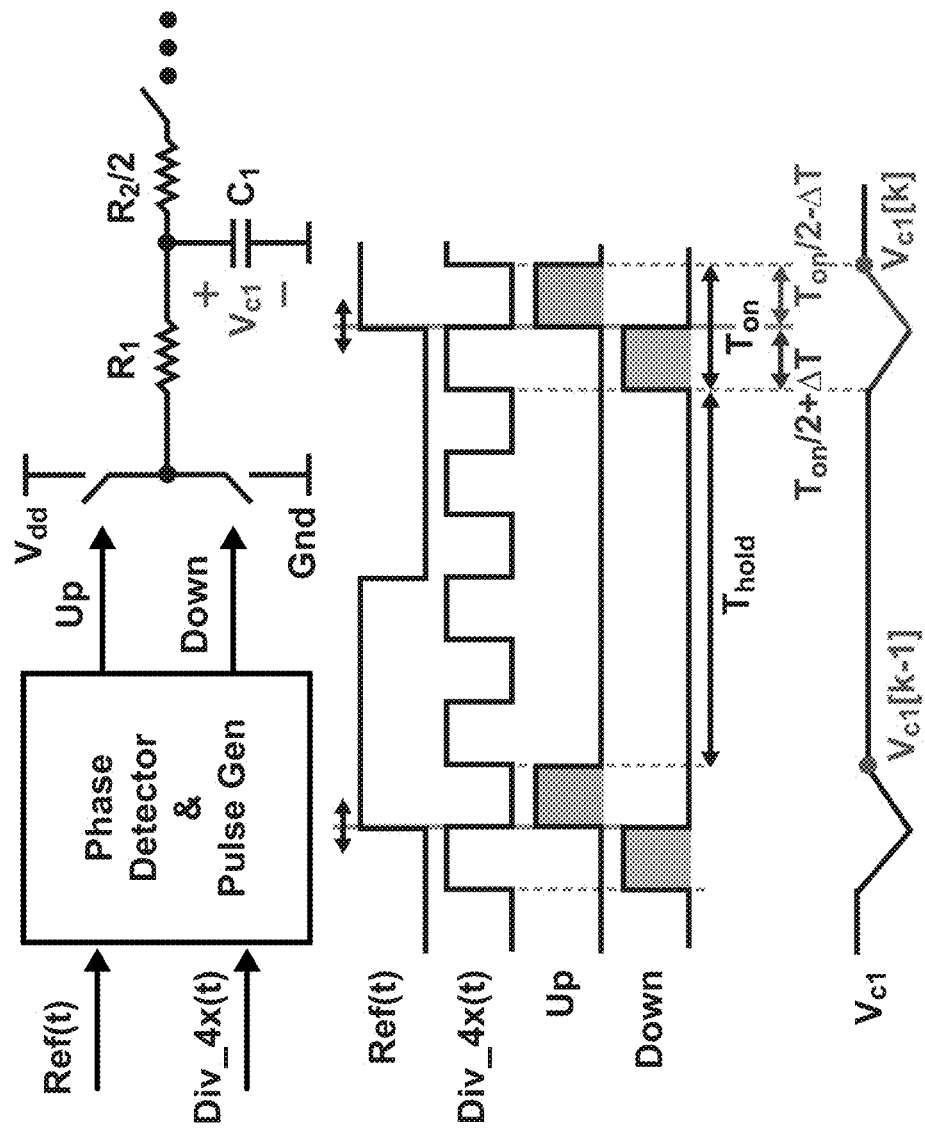
FIG. 26 illustrates instantaneous voltage waveform of RC network as impacted by switched resistor operation.

FIG. 26 illustrates the instantaneous voltage signal on the capacitor of an RC network as the resistor is switched to ground and then the supply voltage with non-overlapping pulses. Defining $T_{on}$ as the combined width of the Up and Down pulses, and $\Delta T$ as the amount of time that the Down pulse is increased and the Up pulse is decreased compared to the embodiment where they have equivalent pulse widths, we can express the instantaneous voltage on capacitor $C_1$ at sample points following the Up/Down pulses as:

$$V_{c1}[k] = -V_{dd} e^{-\frac{1}{R_1 C_1} \frac{T_{div}}{2}} e^{\frac{1}{R_1 C_1} \Delta T} + e^{-\frac{T_{div}}{R_1 C_1}} V_{c1}[k-1] + V_{dd}$$

Since $\Delta T$ directly varies with changes in phase error, the nonlinear relationship between $\Delta T$ and the loop filter voltage, $V_{c1}(t)$, also implies a nonlinear relationship between phase error and the loop filter voltage. One should note that the impact of the nonlinearity is significantly reduced as $\Delta T$ is made small relative to the RC time constant $R_1 C_1$, as seen by:

$$e^{\frac{1}{R_1 C_1} \Delta T} \approx 1 + \frac{\Delta T}{R_1 C_1}$$

The issue of nonlinearity will not generally pose a problem for integer-N phase-locked loops since changes in $\Delta T$ are primarily caused by noise so that $\Delta T \ll R_1 C_1$ is valid. However, in certain instances, the nonlinearity should be considered more carefully in the embodiment of fractional-N phase-locked loops since the dithering of the divide value can cause significant phase error perturbations. In general, the amount of phase error perturbation is a function of the PLL output frequency, divider design, and choice of Sigma-Delta modulator since dithering of the divider causes the phase to move in increments of the PLL output period. As indicated by the above equation, the switched resistor PLL topologies shown in FIGS. 5 and 8 may have suitable nonlinearity where $1/(R_1 C_1)$ is made sufficiently small, though this will generally imply a lower PLL bandwidth.

Figure 27:
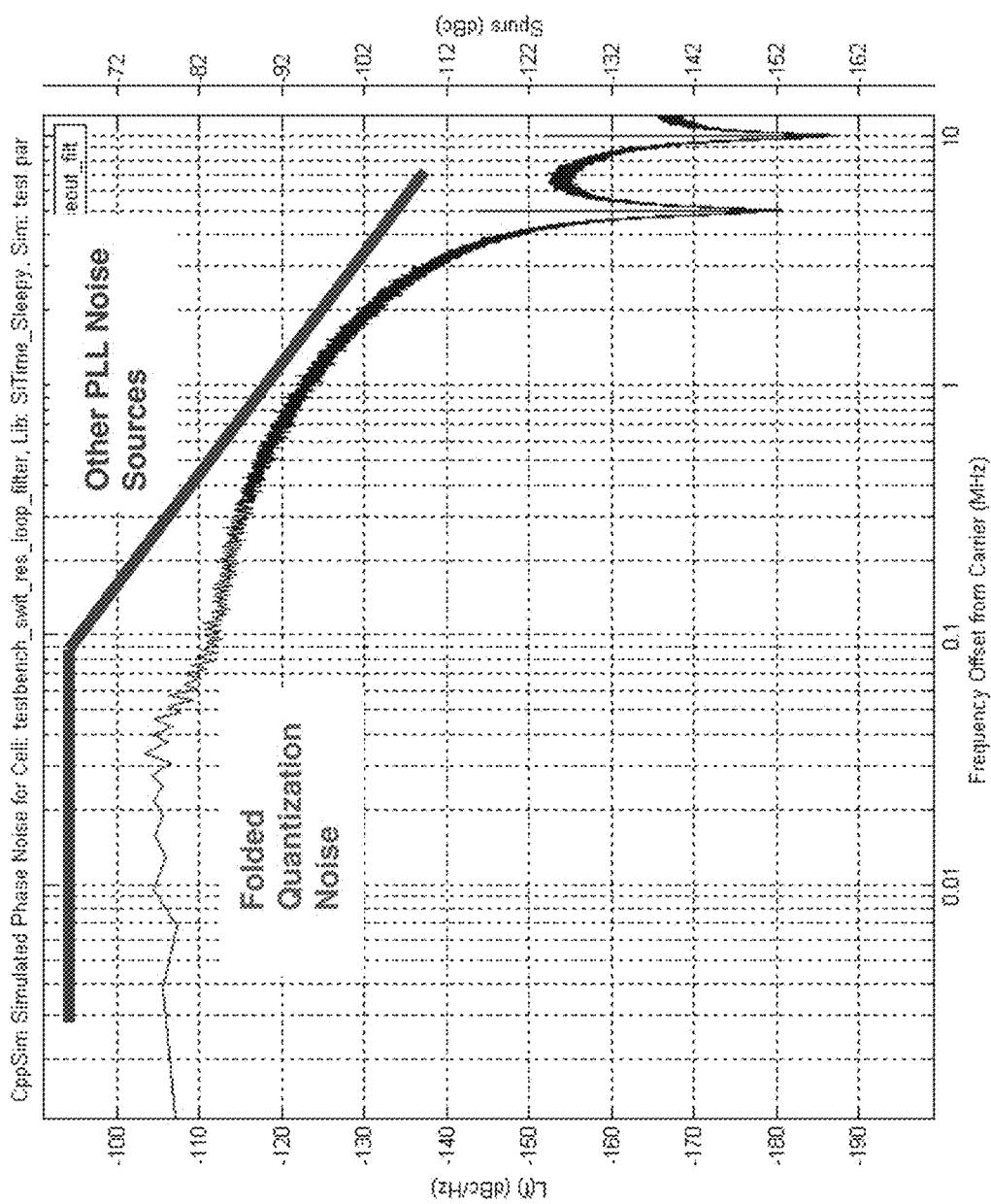
FIG. 27 illustrates exemplary noise folding of quantization noise from divider dithering due to nonlinearity in a switched resistor fractional-N PLL

FIG. 27 illustrates the impact of noise folding due to nonlinearity in a switched resistor fractional-N PLL. Under ideal assumptions, the quantization noise due to divider dithering will be shaped to high frequencies such that there is minimal quantization noise energy at low frequencies. The impact of passing the shaped quantization noise through nonlinearity is to cause noise folding which generally increases the amount of quantization noise energy that occurs at low frequencies. As shown in the example of FIG. 27, significant quantization noise can occur at low frequencies due to the nonlinearity. However, since there are other PLL noise sources, such as reference noise, divider jitter, VCO phase noise, and loop filter noise (from the resistive elements), the folding of quantization noise may remain below that of other noise sources (as shown in the figure). As discussed herein, lowering the bandwidth of the first RC stage in the loop filter (which implies lowering the PLL bandwidth), may reduce the impact of the nonlinearity. Also, lowering the quantization noise by decreasing the phase variation of the divider output (by increasing its input frequency or using an appropriately low order Sigma-Delta modulator topology) may also lower the impact of the nonlinearity (i.e., we want $\Delta T \ll R_1 C_1$).

Figure 28:
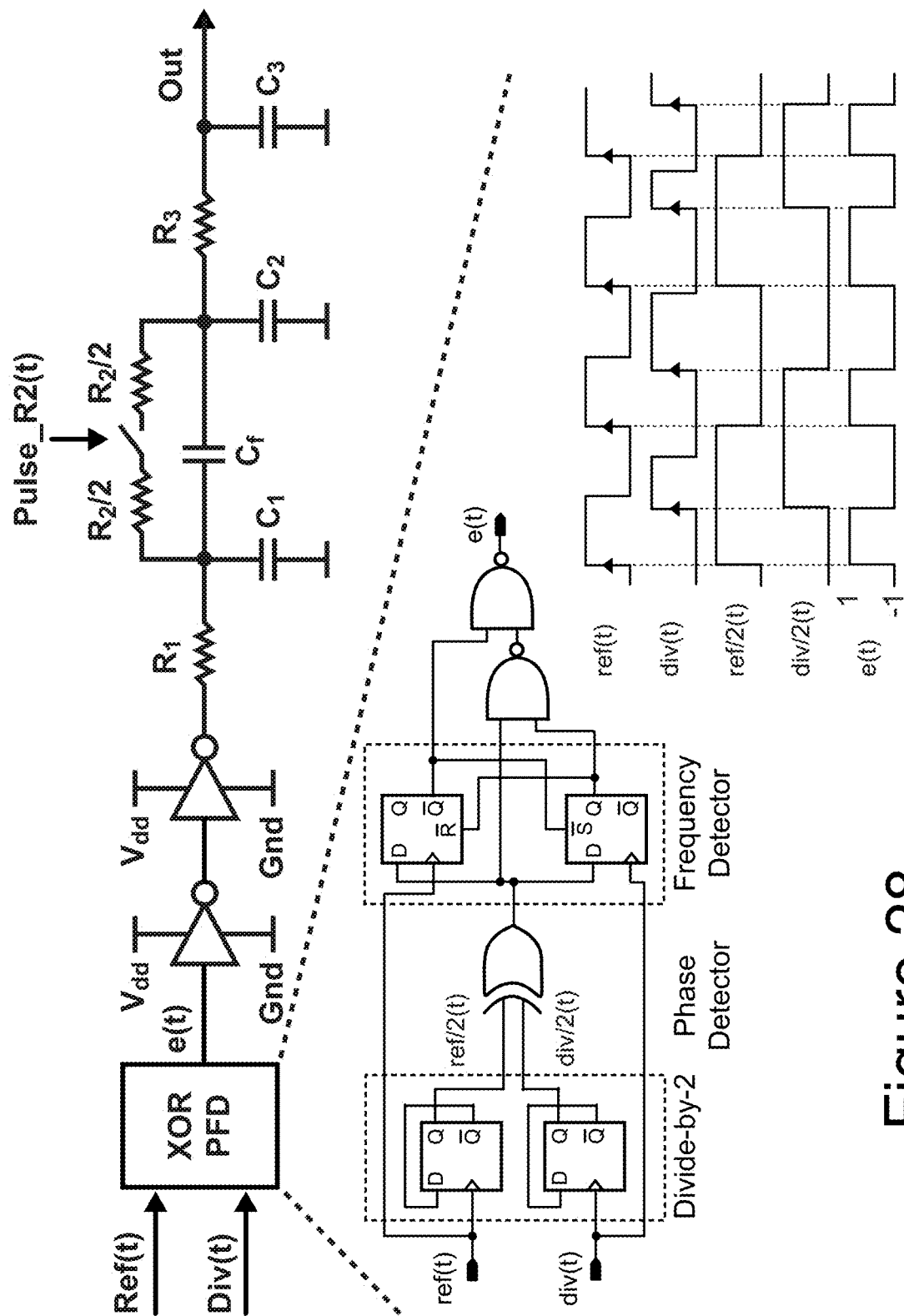
FIG. 28 illustrates an exemplary embodiment of switched resistor PLL topology which lowers the impact of nonlinearity while still allowing wide PLL bandwidth.

In some embodiments, an application will not allow the PLL bandwidth and/or divider phase variation to be lowered sufficiently to prevent the adverse impact of folded quantization noise due to nonlinearity. In such embodiments, the proposed switched resistor PLL topology shown in FIG. 28 would be worthy of consideration. In this structure, high linearity is achieved by using an XOR-based phase detector what has a single binary valued output, as opposed to Up and Down signals. In this embodiment, the output of the PD can be fed directly into an RC filter through the use of a simple inverter. The first RC stage will be highly linear and will act to filter out much of the high frequency energy due to the shaped quantization noise from divider dithering. We can then follow the first RC stage with switched resistor network(s), where FIG. 28 indicates the placement of a switched resistor at the second stage of the loop filter. The value of the switched resistor is to dramatically boost the resistance value so that area savings are achieved on the integrated circuit. In this embodiment, the benefit of boosting the value of $R_2$ is that it helps in achieving a sufficiently low zero in the PLL transfer function such that closed loop stability of the PLL is assured.

Related to the issue of nonlinearity and quantization noise folding, there are a few additional considerations in designing a switched resistor PLL. First, assuming that Up/Down pulses are leveraged as shown in FIG. 26, it may be advantageous to ensure that $T_{on}$ does not change dynamically in time (i.e., due to divide value variations) since it would otherwise introduce another source of nonlinearity in the phase error path. Prevention of such dynamic $T_{on}$ variation can be achieved by maintaining a constant time difference between the key output divider edges, which is accomplished by making the associated divide value constant. For instance, for the divider control shown in FIG. 12, the value $N_1$ would be kept constant by choosing a different divide value (i.e., $N_2$ in the figure) to be controlled by the Sigma-Delta modulator.

The second consideration related to quantization noise folding is the relative frequency chosen for pulsing the switched resistors since subsampling shaped noise also leads to noise folding. As an example, for the switched resistor loop filter shown in FIG. 28, the safest pulse rate would be match the frequency of the phase error signal, e(t), since no subsampling of the quantization noise would occur. However, since the first RC filter stage acts to filter the quantization noise, it may be acceptable to allow subsampling if the impact on the overall PLL noise performance is acceptable. The advantage of subsampling (i.e., choosing the period of the Pulse_R2(t) signal to be less than that of the phase error, e(t)) is that a larger effective resistance can be achieved for the switched resistor, as discussed herein.

D. Configurability

Figure 29:
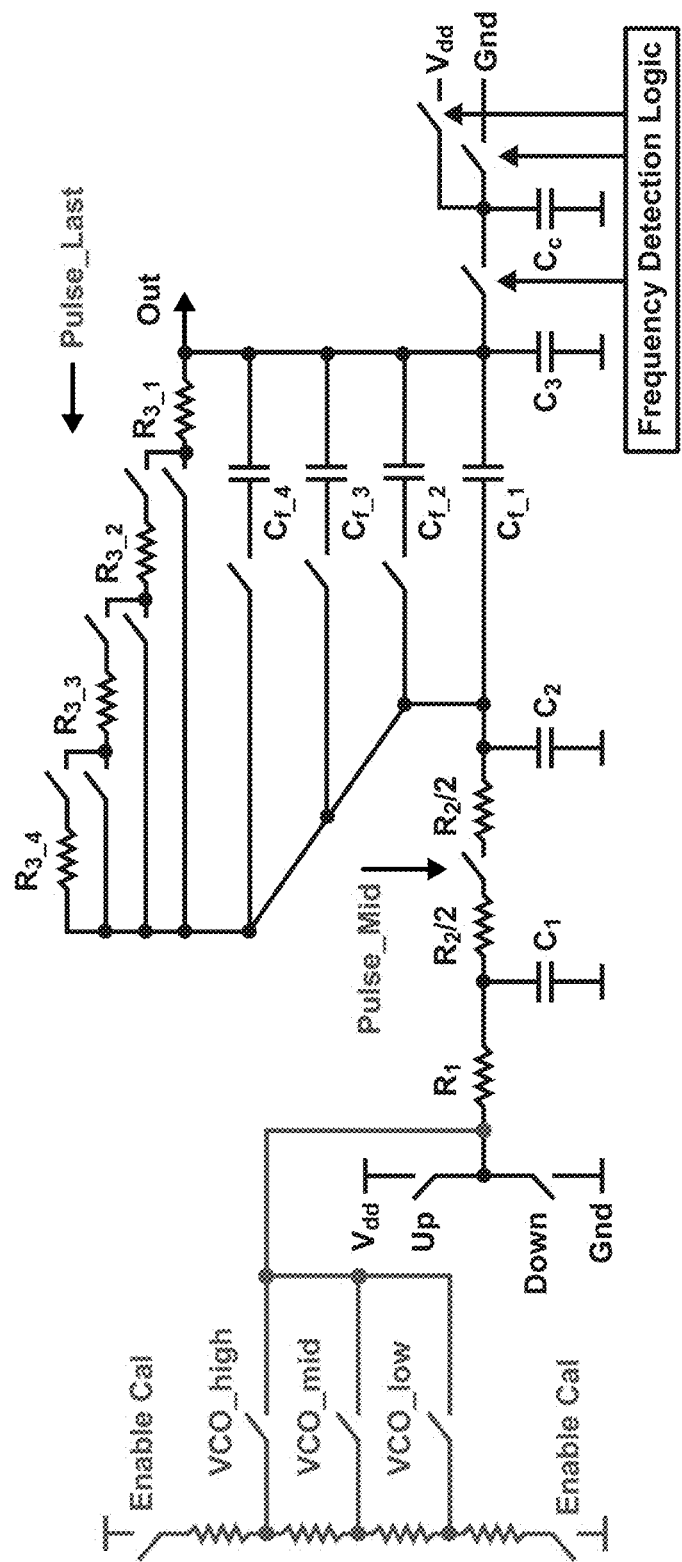
FIG. 29 illustrates an exemplary embodiment of configurable switched resistor loop filter to allow for a range of PLL bandwidths.

In practice, it may be advantageous to have the capability to configure a given PLL implementation over a range of bandwidths and to allow test modes to check PLL functionality. FIG. 29 shows one example of adding such features to a switched resistor PLL. In this embodiment, adjustment of the PLL bandwidth is performed by allowing a change in the capacitance $C_f$ with the use of an array of switches and capacitors ($C_{f\_1}$ through $C_{f\_4}$). Adjustment of $C_f$ changes the open loop gain of the PLL, which changes the open loop unity gain crossover and thus the closed loop PLL bandwidth. In changing $C_f$, one should generally change the stabilizing zero to maintain stability. In this embodiment, we allow modification of the zero by providing an array of switched resistors ($R_{3\_1}$ through $R_{3\_4}$) to realize $R_3$. Although not shown in the figure, we can also create an array of switched resistors for $R_1$ and $R_2$ to change the location of the higher frequency poles of the loop filter.

As for test modes, one useful feature is to be able to run the VCO in open loop at different voltages in order to check its frequency and Kv value. The leftmost circuit in FIG. 29 allows different voltages to be placed on the $R_1$ resistor. Assuming that we enable the switches associated with $R_1$, $R_2$, and $R_3$, and disable the Up and Down pulses as well as frequency detection, we can then tune the VCO control voltage over a variety of settings to check its characteristics.

Figure 30:
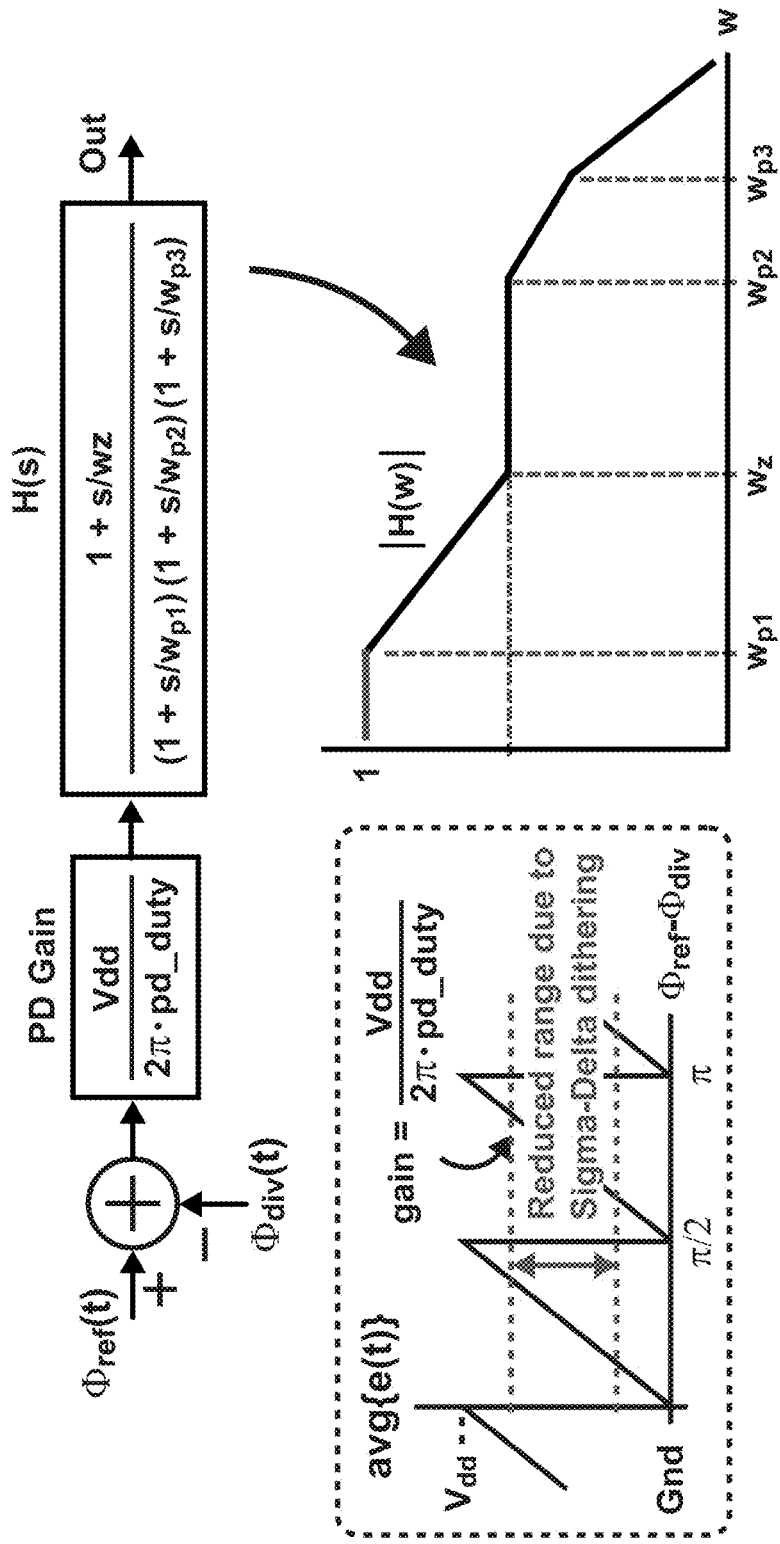
FIG. 30 illustrates exemplary varactor range considerations for a switched resistor PLL.

Another issue related to testing the VCO characteristics is to consider the available range over which its tuning voltage can by varied while the PLL is in operation. As shown in FIG. 30, there are practical limitations to the usable range of the phase detector, especially when dealing with a fractional-N phase-locked loop. For the example in the figure, the usable range in the phase detector characteristic is about half of the total theoretical range due to phase error variation from the Sigma-Delta modulation of the divider value. Since the DC gain of the loop filter may be equal to one for the switched resistor PLL, the usable varactor range may, in certain embodiments, be limited to half of its theoretical range of the entire supply voltage. Note that classical analog phase-locked loops also have a varactor range, which is typically set by the charge pump rather than phase detector. In any case, testing of the VCO may benefit from knowledge of the achievable range by choosing the control voltage values shown in FIG. 29 that coincide with the limits in that range (i.e., ¼ and ¾ the voltage range in this example).

Design Considerations of Exemplary Switched Resistor PLLs

Key considerations of designing a switched resistor PLL may be identification, selection and implementation of the size the loop filter capacitances to achieve a predetermined PLL noise performance, and to design the overall loop filter such that the PLL will be stable (for example, over a predetermined range of operating frequencies). Other issues such as achieving a VCO with a desired frequency range and sufficiently low phase noise and designing the high speed frequency divider and Sigma-Delta modulator (in the embodiment of fractional-N systems, where N>0) for the proper PLL performance are also common to a traditional analog PLL design. One point of differentiation, however, is that a switched resistor PLL will typically benefit from having a higher $K_v$ of the VCO than what might be preferred in a traditional analog PLL due to the reduced DC gain of the switched resistor loop filter.

Figure 31:
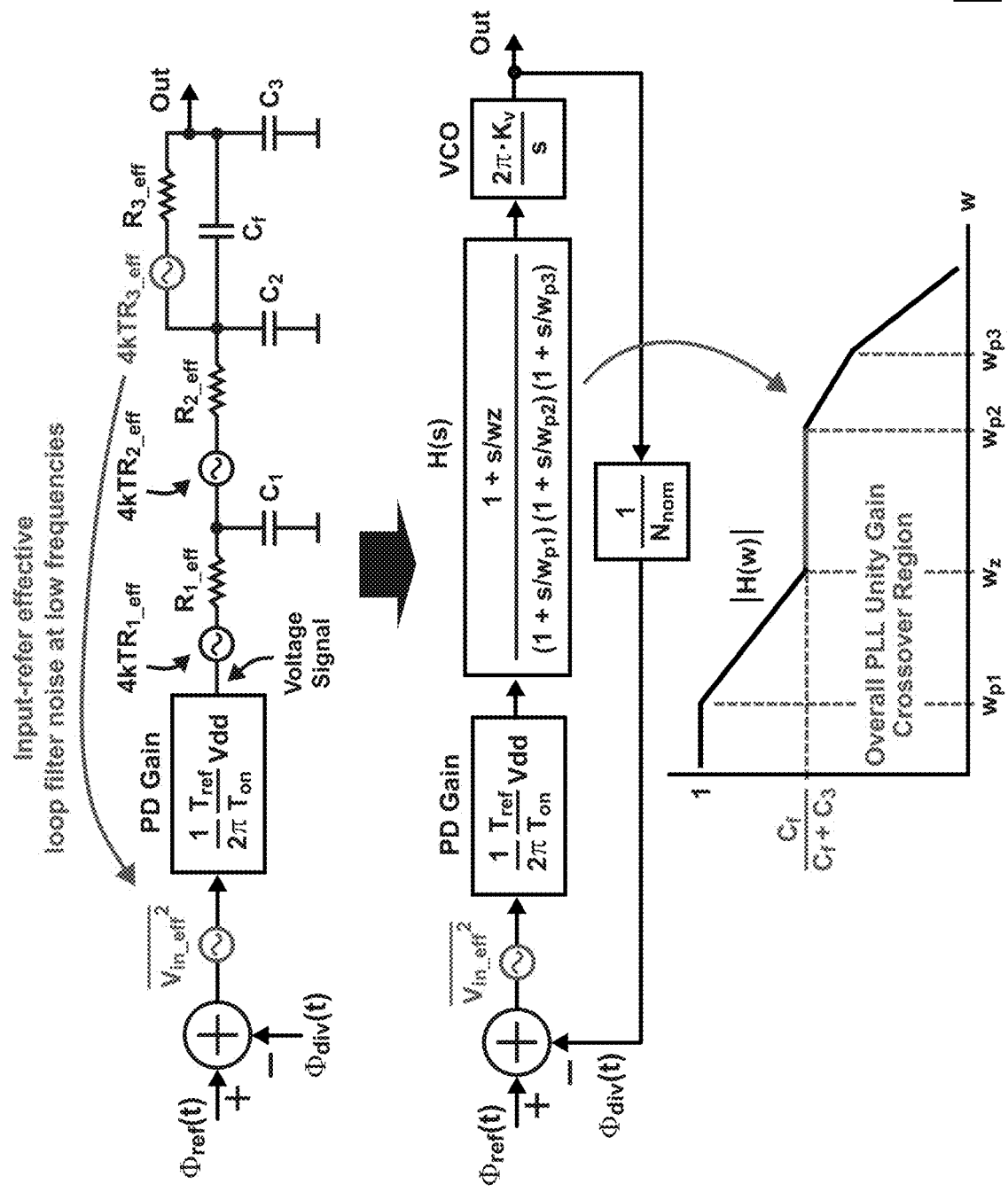
FIG. 31 illustrates certain design consideration/issues for a switched resistor PLL implementation.

As indicated in FIG. 31, the noise of a switched resistor loop filter will often be dominated by the largest resistor in its network, which may correspond to the key resistor that sets the stabilizing zero for the PLL (i.e., $R_{3\_eff}$ in the figure). In order to reduce the $R_{3\_eff}$ noise, we need to reduce the value of $R_{3\_eff}$. To accomplish this $R_{3\_eff}$ reduction, the value of $C_3$ should be increased since to first order, the stabilizing zero, $w_2$, corresponds to $1/(R_{3\_eff}C_3)$.

In addition, as indicated in FIG. 31, the PLL unity gain crossover frequency (which corresponds to the closed loop PLL bandwidth) should typically occur in the flat region of the loop filter transfer function where the gain corresponds to $C_f/(C_f+C_3)$ for the given example. In the embodiment where $C_3$ is increased in order to lower the $R_{3\_eff}$ noise, the value of $C_f$ should also be increased in order to maintain a given unity gain crossover frequency (i.e., closed loop PLL bandwidth). While $C_f$ will typically be smaller in value than $C_3$ in practice, its implementation may be significant in chip area since it may be beneficial to implement $C_f$ with metal capacitors rather than MOS gates in order to maintain a consistent capacitance value over a variety of bias conditions.

The tradeoff in noise performance versus capacitor area is common to both switched resistor and traditional analog PLL implementations. Fortunately, the switched resistor PLL may have a much smaller capacitor area requirement for a given level of noise due to the high gain offered by its phase detector. As indicated in FIG. 31, the high PD gain reduces the effective noise of the loop filter when referring it to the input of the PLL.

Figure 32:
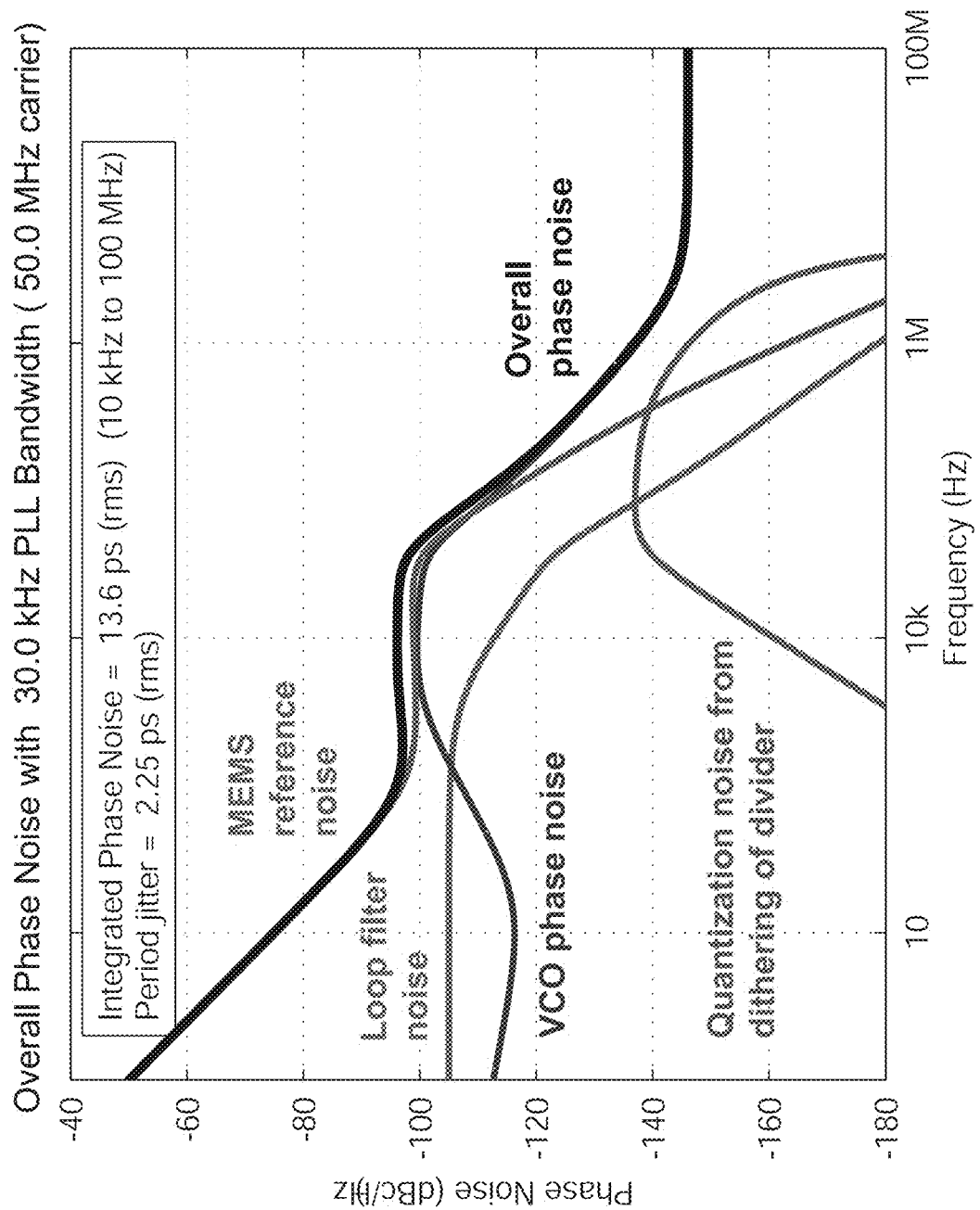
FIG. 32 illustrates phase noise plot from running Matlab script in Appendix 1 of the Provisional Application.

A detailed exemplary design procedure is provided in Appendix I of the Provisional Application in the form of a Matlab script that computes the required resistor and capacitor values of the loop filter given other PLL parameters. An example phase noise plot from this script is shown in FIG. 32, where the indicated phase noise performance is achieved with less than 100 pF of capacitance.

Importantly, the present inventions are neither limited to any single aspect nor embodiment thereof, nor to any combinations and/or permutations of such aspects and/or embodiments. For example, the present inventions are not limited to a switched resistor PLL as described and illustrated above, but are also directed to the components thereof including, for example, the switched resistor network, switched resistor loop filter circuitry, architectures, topologies and techniques, phase detector circuitry and technique, divider circuitry and techniques, and/or circuitry, techniques and signals to control the switched resistor network and/or switched resistor loop filter circuitry. In this way, each of the aspects of the present inventions, and/or embodiments thereof, may be employed alone or in combination with one or more of the other aspects of the present inventions and/or embodiments thereof. For the sake of brevity, many of those permutations and combinations are not discussed separately herein; however, all permutations and combinations are intended to fall within the scope of the present inventions.

As such, the embodiments described and/or illustrated of the present inventions are merely exemplary. They are not intended to be exhaustive or to limit the inventions to the precise circuitry, techniques, and/or configurations disclosed. Many modifications and variations are possible in light of the above teaching—including using certain conventional circuitry and techniques in conjunction with the inventive aspects of, for example, the switched resistor network, switched resistor loop filter circuitry, architectures, topologies and techniques, phase detector circuitry and technique, divider circuitry and techniques, and/or circuitry, techniques and signals to control the switched resistor network and/or switched resistor loop filter circuitry. It is to be understood that other embodiments may be utilized and operational changes may be made without departing from the scope of the present inventions. As such, the foregoing description of the exemplary embodiments of the inventions has been presented for the purposes of illustration and description. It is intended that the scope of the inventions not be limited solely to the description above.

For example, as noted above, while several of the exemplary embodiments of the circuitry and techniques to generate control or switching signals for controlling the resistor network and/or switched resistor loop filter have been described and/or illustrated herein as being integrated in the phase detector circuitry, the control or switching signals may be generated by circuitry (here, a control signal generator) disposed in or not disposed in the phase detector circuitry. (See, FIGS. 33A and 33B, respectively). All circuitry, architectures and/or techniques for generating signals to control the resistor network and/or switched resistor loop filter, consistent with one or more aspects of the present inventions, whether now known or later developed, are intended to fall within the scope thereof.

It should be noted that the term "circuit" may mean, among other things, a single component (for example, electrical/electronic and/or microelectromechanical) or a multiplicity of components (whether in integrated circuit form, discrete form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated, discrete or otherwise), one or more state machines, one or more processors, one or more processors implementing software, one or more gate arrays, programmable gate arrays and/or field programmable gate arrays. The term "data" may mean, among other things, a current or voltage signal(s) whether in an analog or a digital form.

Moreover, "pulsing properties" of the switching or control signal to increase the effective resistance of the switched resistor network include the pulse width and frequency (or period) of such signal. In addition, the circuitry to generate the control or switching signals which changes (increases) the effective resistance of the switched resistor network, whether or not disposed or integrated in the phase detector circuitry, is collectively referred to in the claims as circuitry of the phase detector circuitry (FIG. 33A), unless indicated otherwise.

Notably, the various networks, circuitry described and/or illustrated herein (or portions and/or combinations thereof) may be integrated or may be implemented using a plurality of discrete logic. All permutations and/or combinations of integrated, discrete, hardwired and programmable circuitry (which is programmed, for example, via software) for implementing the circuits and circuitry are intended to fall within the scope of the present inventions. For example, in one embodiment, the switched resistor network, switched resistor loop filter circuitry, architectures and topologies, phase detector circuitry, divider circuitry, and/or circuitry to control the switched resistor network and/or switched resistor loop filter circuitry may be integrated on a monolithic integrated circuit device. In other embodiments, one or more components of the switched resistor PLL may be discrete or integrated on a monolithic integrated circuit device.

It should be further noted that the various circuits and circuitry disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as Matlab, Python, C, Verilog, and HDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations using computer aided design and/or testing tools. The simulation of the switched resistor PLL, and/or components thereof, for example, the switched resistor network, switched resistor loop filter circuitry, architectures and topologies, phase detector circuitry, divider circuitry, and/or circuitry to control the switched resistor network and/or switched resistor loop filter circuitry (or portions of the foregoing), and/or techniques implemented thereby, may be implemented by a computer system wherein characteristics and operations of such circuitry, and techniques implemented thereby, are imitated, replicated and/or predicted via a computer system. The present inventions are also directed to such simulations of the switched resistor PLL, and/or components thereof, and/or techniques implemented thereby, and, as such, are intended to fall within the scope of the present inventions. The computer-readable media corresponding to such simulations and/or testing tools are also intended to fall within the scope of the present inventions.

Notably, for the avoidance of doubt, the present inventions are also applicable to delay-locked loops or other clock alignment circuitry that implements one or more of the switched resistor network, switched resistor loop filter circuitry, architectures and topologies, phase detector circuitry, divider circuitry, and/or circuitry to control the switched resistor network and/or switched resistor loop filter circuitry described and/or illustrated herein. It is intended that such delay-locked loops or other clock alignment circuitry fall within the scope of the present inventions.

What is claimed is:

1. A phase locked loop circuit comprising: comparison circuitry to receive a reference signal and an oscillation signal and to generate an error signal according to a relationship between the reference signal and the oscillation signal; a loop filter to receive an output of the comparison circuitry, the loop filter having an impedance network that is switched as a function of the error signal so as to vary impedance properties of the impedance network; and oscillation circuitry to receive an output of the impedance network and to responsively generate an output signal; wherein the oscillation signal is a function of the output signal.

2. The phase locked loop circuit of claim 1, wherein the comparison circuitry comprises a phase detector that is to produce an up/down signal as a function of phase error between the reference signal and the oscillation signal, and wherein the oscillation circuitry comprises a voltage controlled oscillator that is driven according to an accumulation of integrated phase error between the oscillation signal and the reference signal.

3. The phase locked loop circuit of claim 2, wherein the impedance network comprises at least one metal oxide semiconductor (MOS) device to be switched according to pulses of a control signal driven as a function of change in sign of the up/down signal.

4. The phase locked loop circuit of claim 3, wherein the impedance network comprises at least one polysilicon resistor coupled in series with the MOS device, an effective resistance of the impedance network being dependent on the at least one polysilicon resistor.

5. The phase locked loop circuit of claim 1, wherein the comparison circuitry comprises a phase frequency detector that is to drive an accumulator to adjust control of the oscillation circuitry at separate adjustment rates for each of phase difference and frequency difference between the reference signal and the oscillation signal.

6. The phase locked loop circuit of claim 1, wherein the comparison circuitry comprises a digital phase detector circuit.

7. The phase locked loop circuit of claim 1, wherein the impedance network comprises at least one resistor, at least one capacitor and at least one switch, and wherein the switch is to be switched at a rate such that the impedance network reduces 1/f noise of the oscillation circuitry, where f is a frequency of oscillation of at least one of the reference signal and the oscillation signal.

8. The phase locked loop circuit of claim 1, wherein the phase locked loop circuit further comprises frequency-divider circuitry to divide the output signal by a factor of at least four, to generate the oscillation signal.

9. The phase locked loop circuit of claim 1, wherein the impedance network is a resistance network.

10. The phase locked loop circuit of claim 1, wherein:
the phase locked loop circuit further comprises at least one adjustable capacitor and circuitry to selectively adjust an effective capacitance provided by the at least one adjustable capacitor; and
a loop bandwidth of the phase locked loop circuit is dependent on the effective capacitance.

11. The phase locked loop circuit of claim 1, wherein the impedance network is to be switched according to a pulsed control signal having a pulse duration less than an RC time constant of the impedance network.

12. An integrated circuit, comprising:
a chip;
a phase locked loop circuit on the chip;
the phase locked loop circuit comprising
comparison circuitry to receive a reference signal and an oscillation signal and to generate an error signal according to a relationship between the reference signal and the oscillation signal,
a loop filter to receive an output of the comparison circuitry, the loop filter having an impedance network that is switched as a function of the error signal so as to vary impedance properties of the impedance network, and
oscillation circuitry to receive an output of the impedance network and to responsively generate an output signal;
wherein the oscillation signal is a function of the output signal.

13. The integrated circuit of claim 12, wherein the comparison circuitry comprises a phase detector that is to produce an up/down signal as a function of phase error between the reference signal and the oscillation signal, and wherein the oscillation circuitry comprises a voltage controlled oscillator that is driven according to an accumulation of integrated phase error between the oscillation signal and the reference signal.

14. The integrated circuit of claim 13, wherein the impedance network comprises at least one metal oxide semiconductor (MOS) device to be switched according to pulses of a control signal driven as a function of change in sign of the up/down signal.

15. The integrated circuit of claim 14, wherein the impedance network comprises at least one polysilicon resistor coupled in series with the MOS device, an effective resistance of the impedance network dependent on the at least one polysilicon resistor.

16. The integrated circuit of claim 12, wherein the comparison circuitry comprises a phase frequency detector that is to drive an accumulator to adjust control of the oscillation circuitry at separate adjustment rates for each of phase difference and frequency difference between the reference signal and the oscillation signal.

17. The integrated circuit of claim 12, wherein the comparison circuitry comprises a digital phase detector circuit.

18. The integrated circuit of claim 12, wherein the impedance network comprises at least one resistor, at least one capacitor and at least one switch, and wherein the switch is to be switched at a rate such that the impedance network reduces 1/f noise of the oscillation circuitry, where f is a frequency of oscillation of at least one of the reference signal and the oscillation signal.

19. The integrated circuit of claim 12, wherein:
the phase locked loop circuit further comprises at least one adjustable capacitor and circuitry to selectively adjust an effective capacitance provided by the at least one adjustable capacitor; and
a loop bandwidth of the phase locked loop circuit is dependent on the effective capacitance.

20. The integrated circuit of claim 12, wherein the impedance network is to be switched according to a pulsed control signal having a pulse duration less than an RC time constant of the impedance network.

21. A method of operation in a phase locked loop circuit having comparison circuitry, a loop filter having an impedance network, and oscillation circuitry, the method comprising:
comparing a reference signal and an oscillation signal with the comparison circuitry and responsively generating an error signal according to a relationship between the reference signal and the oscillation signal;
receiving an output of the comparison circuitry with the loop filter and using an output of the loop filter to control the oscillation circuitry; and
switching the impedance network as a function of the error signal so as to vary impedance properties of the impedance network and thereby adjust the output of the loop filter;
wherein the oscillation signal is a function of the output signal.

* * * * *